US012610547B2

(12) United States Patent
Son et al.

(10) Patent No.:     US 12,610,547 B2
(45) Date of Patent:         Apr. 21, 2026

(54) THREE-DIMENSIONAL SEMICONDUCTOR MEMORY DEVICE, METHOD OF FABRICATING THE SAME, AND ELECTRONIC SYSTEM INCLUDING THE SAME

(71) Applicant: SAMSUNG ELECTRONICS CO., LTD., Suwon-si (KR)

(72) Inventors: Younghwan Son, Hwaseong-si (KR); Dongkeun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 863 days.

(21) Appl. No.: 17/876,877

(22) Filed: Jul. 29, 2022

(65)        Prior Publication Data

US 2023/0200072 A1     Jun. 22, 2023

(30)        Foreign Application Priority Data

Dec. 22, 2021     (KR) ......................... 10-2021-0184912

(51) Int. Cl.
*H10B 43/27*            (2023.01)
*H10B 41/10*            (2023.01)
        (Continued)

(52) U.S. Cl.
CPC ............. *H10B 43/27* (2023.02); *H10B 41/10* (2023.02); *H10B 41/27* (2023.02); *H10B 41/35* (2023.02);
        (Continued)

(58) Field of Classification Search
CPC ......... H10B 43/27; H10B 43/35; H10B 41/50
See application file for complete search history.

(56)        References Cited

U.S. PATENT DOCUMENTS 6,326,270 B1     12/2001 Lee et al.
6,410,403 B1 *   6/2002 Wu ................... H01L 21/76224
                                                        438/692
        (Continued)

FOREIGN PATENT DOCUMENTS

KR        10-0284905 B1     4/2001
KR        10-0885922 B1     2/2009
        (Continued)

*Primary Examiner* — Jeff W Natalini
*Assistant Examiner* — Jacob Raul Marin
(74) *Attorney, Agent, or Firm* — Muir Patent Law, PLLC

(57)        ABSTRACT

Provided is a method including forming a mold structure including insulating layers and sacrificial layers alternately stacked on a semiconductor substrate, the insulating layers exposing stepwise-stacked ends of the sacrificial layers on a connection region of the semiconductor substrate, forming a sacrificial oxide layer to cover the exposed ends, forming sacrificial pad patterns on the exposed ends, respectively, forming a planarization insulating layer to cover the sacrificial oxide layer and the sacrificial pad patterns, forming a vertical contact hole to penetrate the planarization insulating layer, each of the sacrificial pad patterns, the sacrificial oxide layer and the mold structure, removing each of the sacrificial pad patterns to form a recess region, removing a portion of the sacrificial oxide layer exposed by the recess region to form an extended recess region, and forming a cell contact plug to fill the vertical contact hole and the extended recess region.

20 Claims, 27 Drawing Sheets

(51) Int. Cl.

| | |
|---|---|
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |

(52) U.S. Cl.
    CPC ............. *H10B 41/40* (2023.02); *H10B 43/10*
        (2023.02); *H10B 43/35* (2023.02); *H10B*
                                    *43/40* (2023.02)

(56) References Cited

U.S. PATENT DOCUMENTS

| | | | |
|---|---|---|---|
| 8,941,164 | B2 | 1/2015 | Cho et al. |
| 9,543,317 | B2 | 1/2017 | Kim |
| 9,564,433 | B2 | 2/2017 | Liaw |
| 9,911,692 | B2 | 3/2018 | Smith et al. |
| 9,991,271 | B2 | 6/2018 | Kang et al. |
| 10,283,566 | B2 | 5/2019 | Sel et al. |
| 10,395,982 | B2 | 8/2019 | Nam et al. |
| 10,490,569 | B2 | 11/2019 | Mushiga et al. |
| 10,504,914 | B2 | 12/2019 | Wang |
| 10,991,717 | B2 | 4/2021 | Baek |
| 11,107,508 | B2 * | 8/2021 | Hosotani ................ G11C 16/08 |
| 11,164,886 | B2 | 11/2021 | Baek |
| 11,296,021 | B2 | 4/2022 | Lee |
| 2019/0035733 | A1 * | 1/2019 | Park ..................... H01L 23/535 |
| 2019/0267323 | A1 | 8/2019 | Smith et al. |
| 2020/0365616 | A1 * | 11/2020 | Baek ...................... H10B 43/40 |
| 2020/0402996 | A1 * | 12/2020 | Cheon ................... H10B 43/10 |
| 2021/0193672 | A1 * | 6/2021 | Kim ...................... H10B 43/50 |
| 2022/0157831 | A1 * | 5/2022 | Baek ...................... H10B 43/40 |

FOREIGN PATENT DOCUMENTS

| | | | |
|---|---|---|---|
| KR | 1020160071947 | A | 6/2016 |
| KR | 1020190006142 | A | 1/2019 |
| KR | 1020200132136 | A | 11/2020 |
| KR | 1020210025031 | A | 3/2021 |
| KR | 1020210039183 | A | 4/2021 |
| KR | 20210066763 | A | 6/2021 |

* cited by examiner

THREE-DIMENSIONAL SEMICONDUCTOR MEMORY DEVICE, METHOD OF FABRICATING THE SAME, AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0184912, filed on Dec. 22, 2021, in the Korean Intellectual Property Office, the entire contents of which are hereby incorporated by reference.

BACKGROUND

1. Field

Embodiments relate to a three-dimensional semiconductor memory device, a method of fabricating the same, and an electronic system including the same.

2. Description of the Related Art

A semiconductor device capable of storing a large amount of data may be used as a data storage of an electronic system. Higher integration of semiconductor devices has been pursued to satisfy consumer demands for large data storing capacity, superior performance, and inexpensive prices. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells may be considered.

SUMMARY

According to an embodiment, a method of fabricating a three-dimensional semiconductor memory device may include forming a mold structure on a semiconductor substrate including a cell array region and a connection region, the mold structure including insulating layers and sacrificial layers alternately stacked in a vertical direction, the insulating layers exposing end portions of the sacrificial layers on the connection region, the exposed end portions of the sacrificial layers forming a stepwise structure on the connection region, forming a sacrificial oxide layer on the mold structure to cover the exposed end portions of the sacrificial layers, forming sacrificial pad patterns on the exposed end portions of the sacrificial layers, respectively, the sacrificial oxide layer being interposed between the exposed end portions of the sacrificial layers and the sacrificial pad patterns, forming vertical contact holes to penetrate the sacrificial pad patterns, respectively, and to penetrate the sacrificial oxide layer and the mold structure below the sacrificial pad patterns, removing the sacrificial pad patterns, which are exposed by the vertical contact holes, to form first horizontal recess regions, recessing the sacrificial layers, which are exposed by each of the vertical contact holes, to form second horizontal recess regions, and forming blocking patterns to fill the second horizontal recess regions, removing a portion of the sacrificial oxide layer, which is exposed by the first horizontal recess regions, to form extended first horizontal recess regions, and forming a cell contact plug to fill each of the vertical contact holes and each of the extended first horizontal recess regions.

According to an embodiment, a method of fabricating a three-dimensional semiconductor memory device may include forming a mold structure on a semiconductor substrate including a cell array region and a connection region, the mold structure including insulating layers and sacrificial layers alternately stacked in a vertical direction, the insulating layers exposing end portions of the sacrificial layers on the connection region, the exposed end portions of the sacrificial layers forming a stepwise structure on the connection region, forming a sacrificial oxide layer on the mold structure to cover the exposed end portions of the sacrificial layers, forming sacrificial pad patterns on the exposed end portions of the sacrificial layers, respectively, the sacrificial oxide layer being interposed between the exposed end portions of the sacrificial layers and the sacrificial pad patterns, forming a planarization insulating layer on the mold structure to cover the sacrificial oxide layer and the sacrificial pad patterns, forming a vertical contact hole to penetrate the planarization insulating layer and to penetrate each of the sacrificial pad patterns, the vertical contact hole penetrating the sacrificial oxide layer and the mold structure below each of the sacrificial pad patterns, removing each of the sacrificial pad patterns to form a first horizontal recess region laterally extended from the vertical contact hole, removing a portion of the sacrificial oxide layer exposed by the first horizontal recess region to form an extended first horizontal recess region, and forming a cell contact plug to fill the vertical contact hole and the extended first horizontal recess region.

According to an embodiment, a three-dimensional semiconductor memory device may include a semiconductor substrate including a cell array region and a connection region, an electrode structure on the semiconductor substrate, the electrode structure including insulating layers and gate electrodes, which are alternately stacked in a vertical direction, pad portions of the gate electrodes forming a stepwise structure on the connection region, separation structures penetrating the electrode structure, the separation structures extended from the cell array region to the connection region in a first direction, and spaced apart from each other in a second direction crossing the first direction, the first and second directions being parallel to a top surface of the semiconductor substrate, and cell contact plugs penetrating the pad portions of the gate electrodes, respectively. The cell contact plugs may be disposed on the connection region and between the separation structures. Each of the cell contact plugs may include a vertical portion penetrating each of the pad portions and a horizontal portion, which is horizontally extended from the vertical portion to a region on a top surface of each of the pad portions. The horizontal portion of each of the cell contact plugs may be spaced apart from the separation structures.

According to an embodiment, an electronic system may include a main substrate, a semiconductor device on the main substrate, and a controller provided on the main substrate and electrically connected to the semiconductor device. The semiconductor device may include a semiconductor substrate including a cell array region and a connection region, an electrode structure on the semiconductor substrate, the electrode structure including insulating layers and gate electrodes alternately stacked in a vertical direction, pad portions of the gate electrodes forming a stepwise structure on the connection region, separation structures penetrating the electrode structure, the separation structures extended from the cell array region to the connection region in a first direction, and spaced apart from each other in a second direction crossing the first direction, the first and second directions being parallel to a top surface of the semiconductor substrate, and cell contact plugs penetrating the pad portions of the gate electrodes, respectively. The cell contact plugs may be disposed on the connection region and between the separation structures. Each of the cell contact plugs may include a vertical portion penetrating each of the pad portions and a horizontal portion, which is horizontally extended from the vertical portion to a region on a top surface of each of the pad portions. The horizontal portion of each of the cell contact plugs may be spaced apart from the separation structures.

BRIEF DESCRIPTION OF THE DRAWINGS

Features will become apparent to those of skill in the art by describing in detail example embodiments with reference to the attached drawings in which:

FIGS. 3 and 4 are sectional views, which are respectively taken along lines I-I' and II-II' of FIG. 2 to illustrate a semiconductor package including a three-dimensional semiconductor memory device according to an example embodiment.

FIG. 5 is a plan view illustrating a three-dimensional semiconductor memory device according to an example embodiment.

FIGS. 8A to 15A are sectional views, which are taken along the line A-A' of FIG. 5 to illustrate a method of fabricating a three-dimensional semiconductor memory device according to an example embodiment.

FIGS. 8B to 15B are sectional views illustrating a method of fabricating a three-dimensional semiconductor memory device according to an example embodiment and in particular corresponding to the lines B-B' and C-C' of FIG. 5.

DETAILED DESCRIPTION

Figure 1:
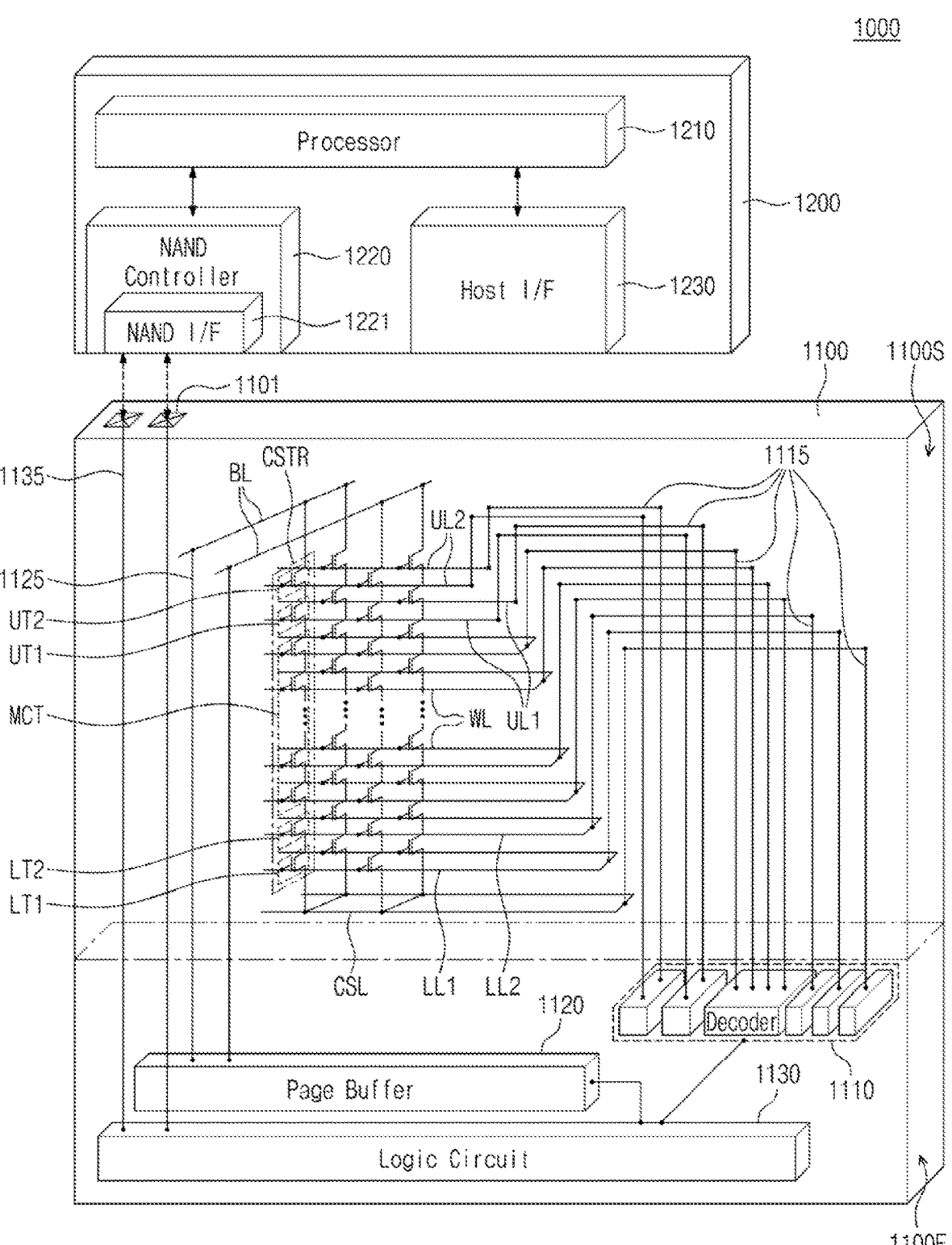
FIG. 1 is a schematic diagram illustrating an electronic system including a three-dimensional semiconductor memory device according to an example embodiment.

FIG. 1 is a schematic diagram illustrating an electronic system including a three-dimensional semiconductor memory device according to an example embodiment.

Referring to FIG. 1, an electronic system 1000 according to an example embodiment may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100, or an electronic device including the storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. In an example embodiment, unlike illustrated in the drawings, the first region 1100F may be disposed at a side of the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2, which are provided adjacent to the common source line CSL, second transistors UT1 and UT2, which are provided adjacent to the bit line BL, and a plurality of memory cell transistors MCT, which are disposed between the first transistors LT1 and LT2 and the second transistors UT1 and UT2. The number of the first transistors LT1 and LT2 and the number of the second transistors UT1 and UT2 may be variously changed, according to example embodiments.

In an example embodiment, the first transistors LT1 and LT2 may include a ground selection transistor, and the second transistors UT1 and UT2 may include a string selection transistor. The first lines LL1 and LL2 may be used as respective gate electrodes of the first transistors LT1 and LT2. The word lines WL may be used as respective gate electrodes of the memory cell transistors MCT. The second lines UL1 and UL2 may be used as respective gate electrodes of the second transistors UT1 and UT2.

For example, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to execute a control operation on at least one of the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. In an example embodiment, the electronic system 1000 may include a plurality of three-dimensional semiconductor memory devices 1100, and in this case, the controller 1200 may be configured to control the three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, and data, which will be written in or read from the memory cell transistors MCT of the three-dimensional semiconductor memory device 1100. The host interface 1230 may be configured to allow for communication between the electronic system 1000 and an external host. If a control command is received from the external host through the host interface 1230, the processor 1210 may control the semiconductor device 1100 in response to the control command.

Figure 2:
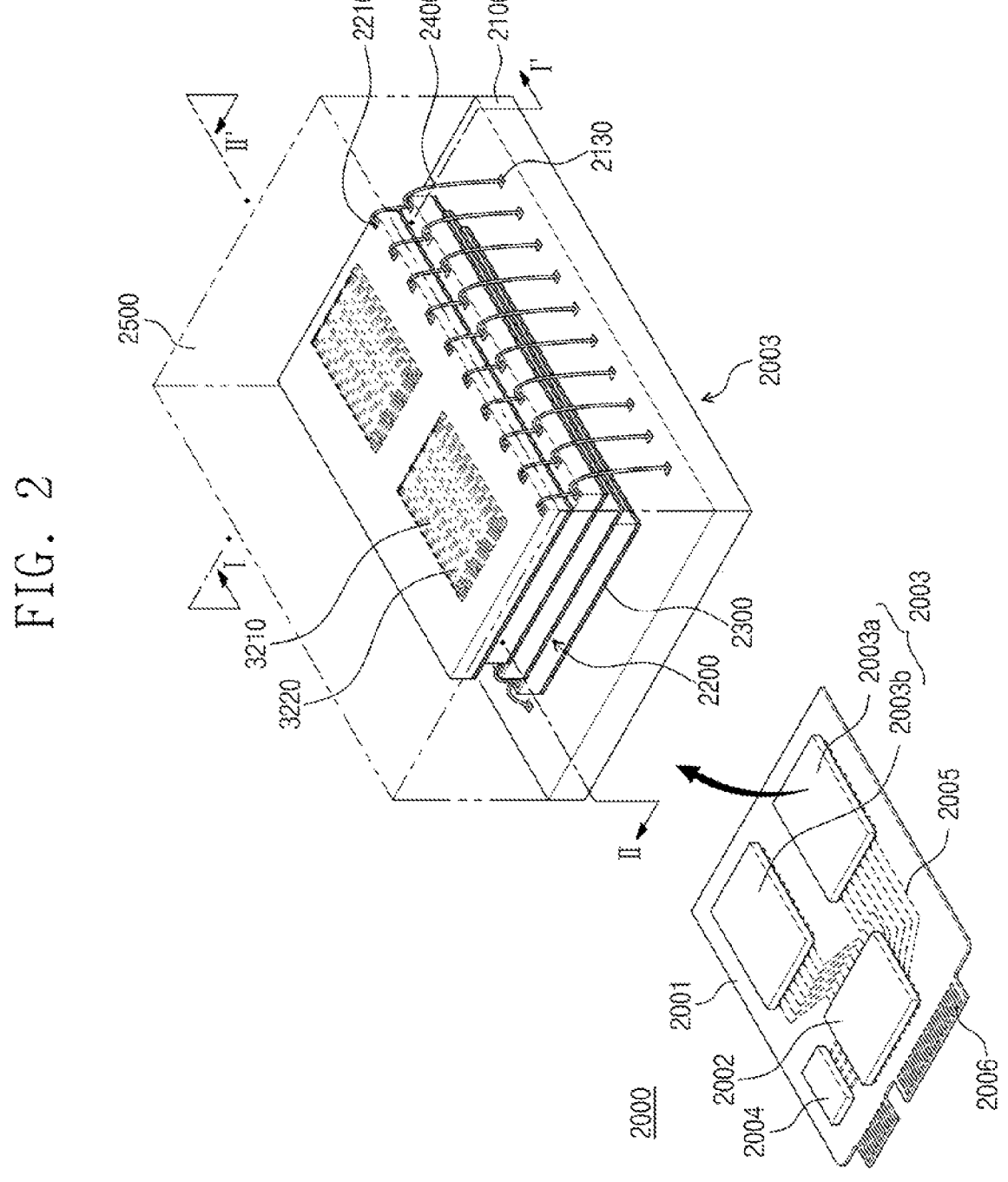
FIG. 2 is a perspective view schematically illustrating an electronic system including a three-dimensional semiconductor memory device according to an example embodiment.

FIG. 2 is a perspective view schematically illustrating an electronic system including a three-dimensional semiconductor memory device according to an example embodiment.

Referring to FIG. 2, an electronic system 2000 according to an example embodiment may include a main substrate 2001, a controller 2002, at least one semiconductor package 2003, and DRAM 2004, which are mounted on the main substrate 2001. The semiconductor package 2003 and the DRAM 2004 may be connected to the controller 2002 and to each other through interconnection patterns 2005, which are provided in the main substrate 2001.

The main substrate 2001 may include a connector 2006, which includes a plurality of pins coupled to an external host. The number and arrangement of the pins in the connector 2006 may depend on a communication interface between the electronic system 2000 and the external host. In an example embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an example embodiment, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may be configured to control a data-writing or data-reading operation on the semiconductor package 2003 and to improve an operation speed of the electronic system 2000.

The DRAM 2004 may be a buffer memory, which mitigates a difference in speed between the semiconductor package 2003, which serves as a data storage device, and an external host. In an example embodiment, the DRAM 2004 in the electronic system 2000 may serve as a cache memory and may be used as a storage space, which is configured to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chip 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 provided on the package substrate 2100 to cover the semiconductor chips 2200 and the connection structure 2400.

The package substrate 2100 may be a printed circuit board, which includes package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and vertical channel structures 3220. Each of the semiconductor chips 2200 may include a three-dimensional semiconductor memory device, which will be described below.

In an example embodiment, the connection structure 2400 may be a bonding wire electrically connecting the input/output pads 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In an example embodiment, the semiconductor chips 2200 in each of the first and second semiconductor packages 2003a and 2003b may be electrically connected to each other by through silicon vias (TSVs), not by the connection structure 2400 provided in the form of bonding wires.

In an example embodiment, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
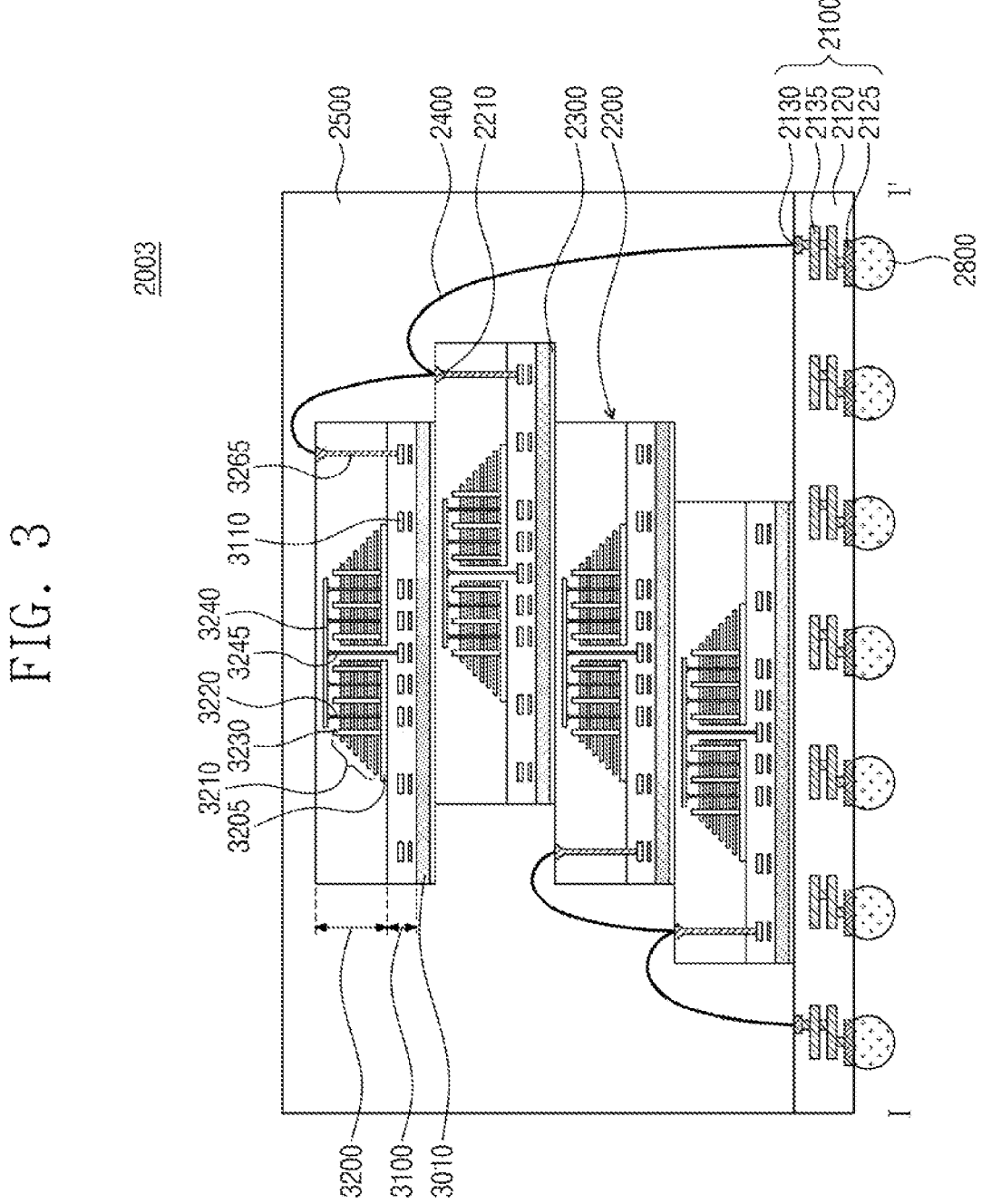
Figure 4:
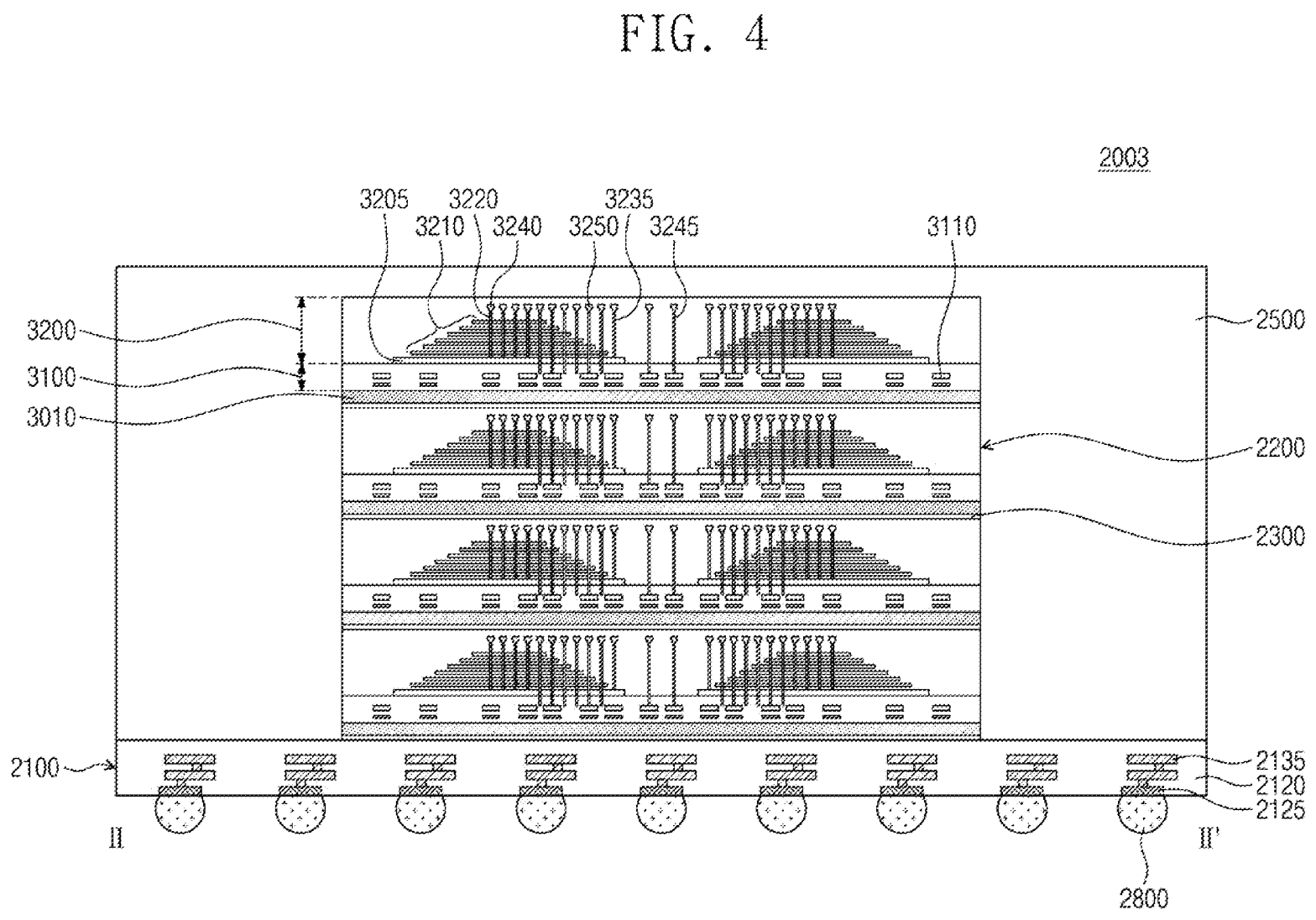

FIGS. 3 and 4 are sectional views, which are respectively taken along lines I-I' and II-II' of FIG. 2 to illustrate a semiconductor package including a three-dimensional semiconductor memory device according to an example embodiment.

Referring to FIGS. 3 and 4, the semiconductor package 2003 may include a package substrate 2100, a plurality of semiconductor chips 2200 on the package substrate 2100, and a molding layer 2500 covering the package substrate 2100 and the semiconductor chips 2200.

The package substrate 2100 may include a package substrate body portion 2120, upper pads 2130 disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region, which includes peripheral lines 3110. The second structure 3200 may include a common source line 3205, the gate stack 3210 on the common source line 3205, the vertical channel structures 3220 and separation structures 3230 penetrating the gate stack 3210, bit lines 3240 electrically connected to the vertical channel structures 3220, gate interconnection lines 3235 electrically connected to word lines (e.g., WL of FIG. 1) of the gate stack 3210, and conductive lines 3250. At least one of the gate interconnection lines 3235 may be electrically connected to one of the word lines WL, may penetrate others of the word lines WL, and may be electrically connected to the peripheral lines 3110 of the first structure 3100. At least one of the gate interconnection lines 3235 may be electrically connected to the common source line 3205. The gate interconnection line 3235, which is electrically connected to one of the word lines WL, may be formed when a penetration line 3245 is formed.

Each of the semiconductor chips 2200 may include penetration lines 3245, which are electrically connected to the peripheral lines 3110 of the first structure 3100 and are extended into the second structure 3200. The penetration line 3245 may be provided to penetrate the gate stack 3210 and may be further disposed outside the gate stack 3210. Each of the semiconductor chips 2200 may further include an input/output interconnection line 3265, which is extended into the second structure 3200 and is electrically connected to the peripheral line 3110 of the first structure 3100, and an input/output pad 2210, which is electrically connected to the input/output interconnection line 3265.

Figure 5:
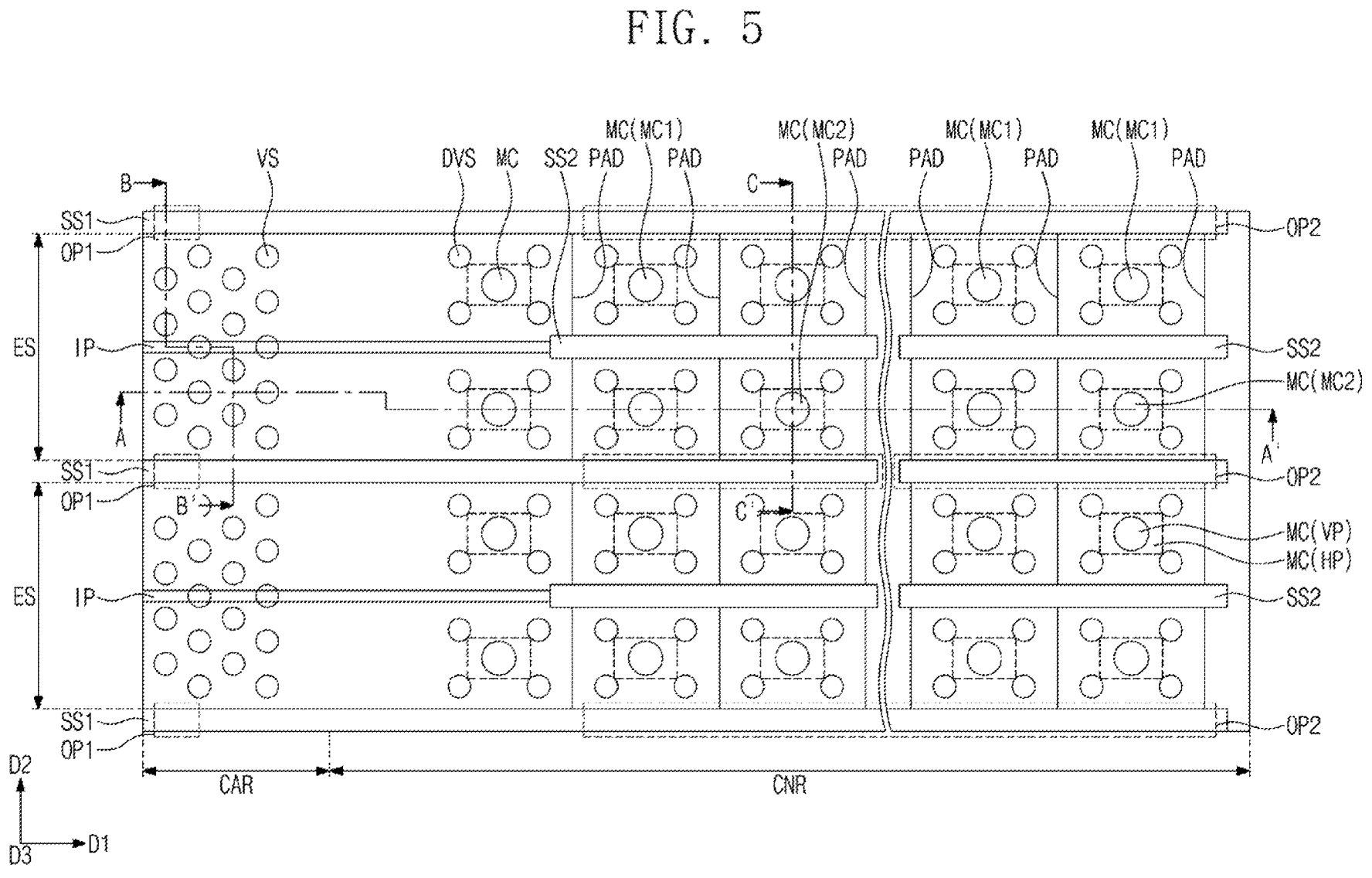
Figure 6A:
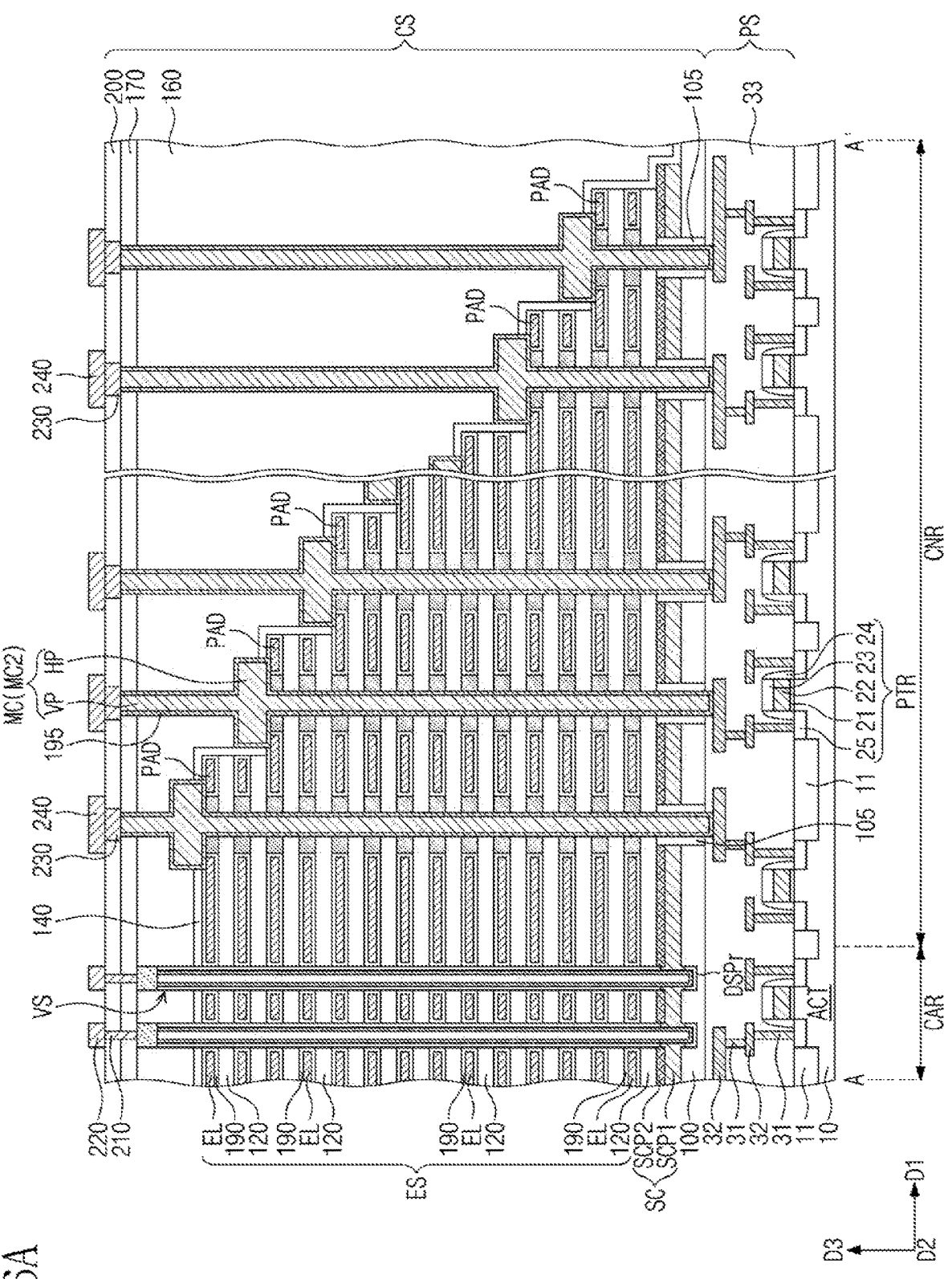
FIG. 6A is a sectional view taken along a line A-A' of FIG. 5.
Figure 6B:
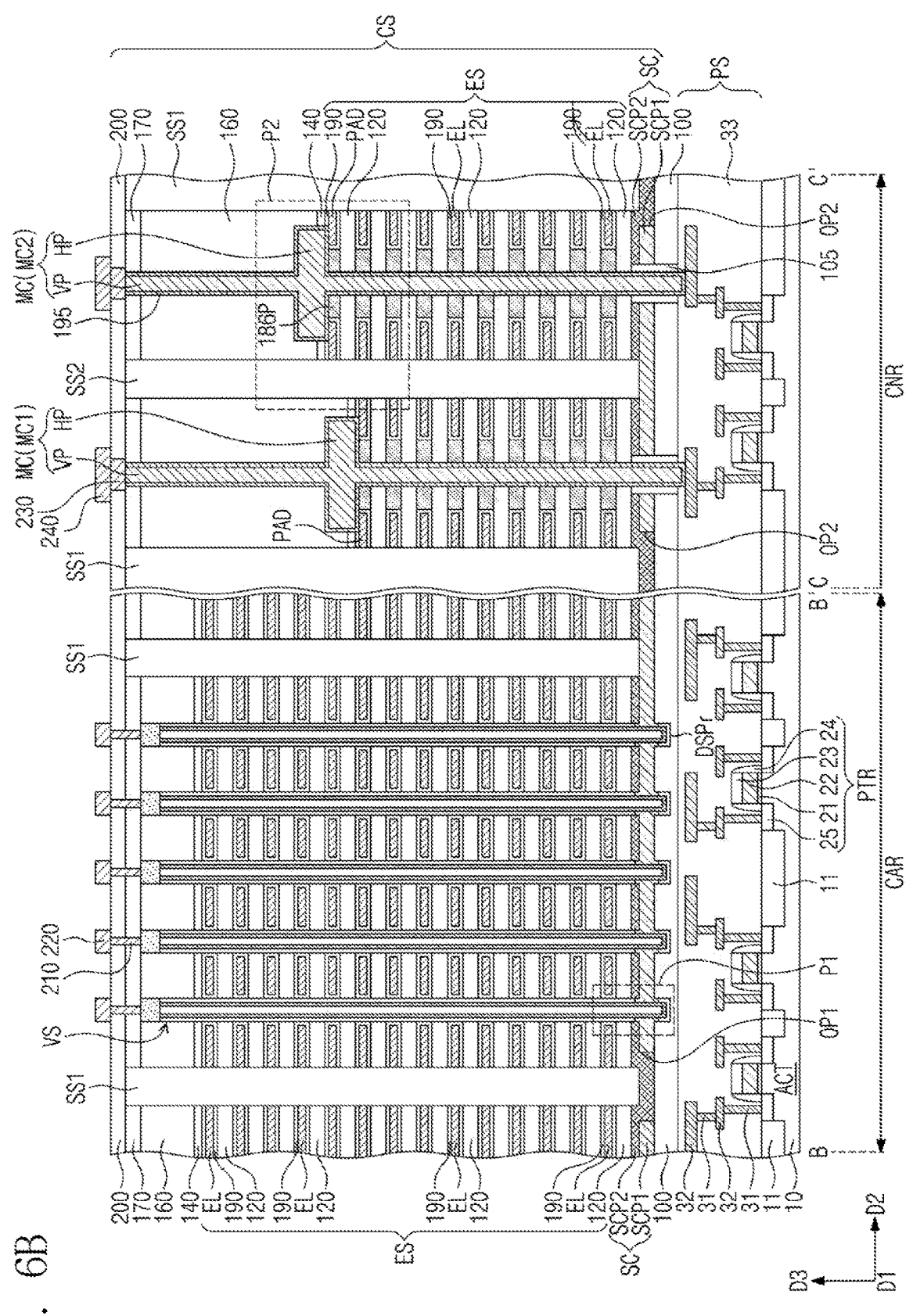
FIG. 6B is a sectional view taken along lines B-B' and C-C' of FIG. 5.
Figure 7A:
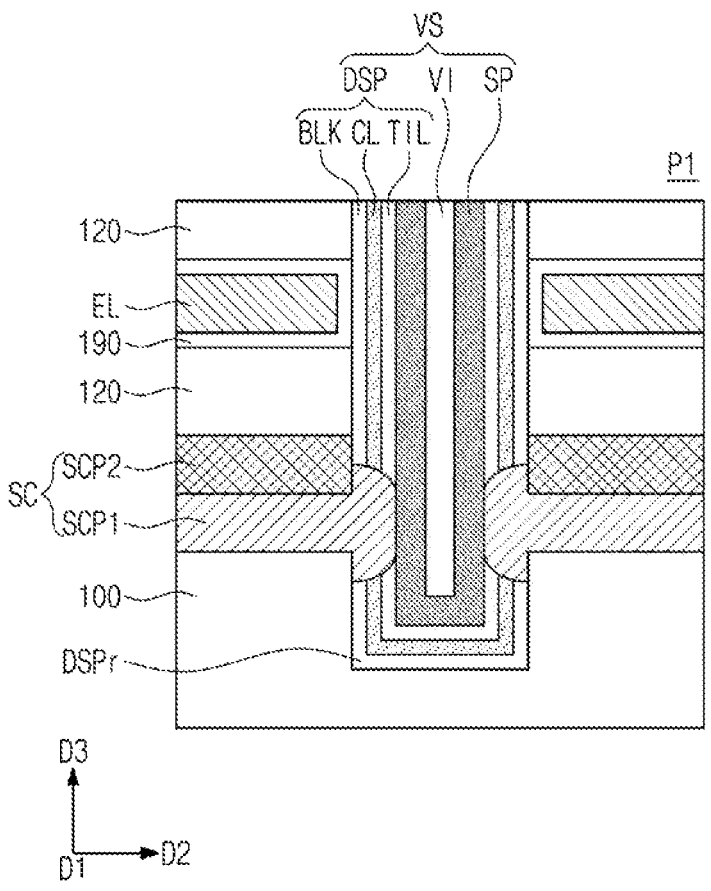
FIG. 7A is an enlarged sectional view illustrating a portion 'P1' of FIG. 6B.
Figure 7B:
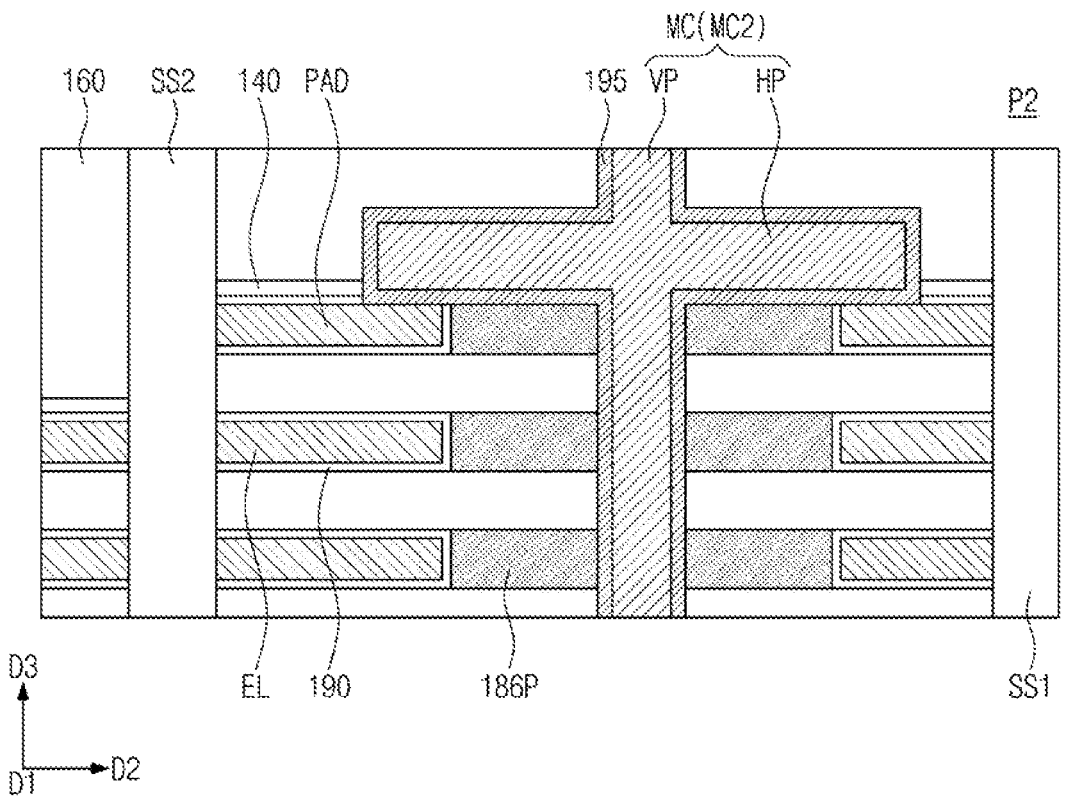
FIG. 7B is an enlarged sectional view illustrating a portion 'P2' of FIG. 6B.

FIG. 5 is a plan view illustrating a three-dimensional semiconductor memory device according to an example embodiment. FIG. 6A is a sectional view taken along a line A-A' of FIG. 5, and FIG. 6B is a sectional view taken along lines B-B' and C-C' of FIG. 5. FIG. 7A is an enlarged sectional view illustrating a portion 'P1' of FIG. 6B, and FIG. 7B is an enlarged sectional view illustrating a portion 'P2' of FIG. 6B.

Referring to FIGS. 5, 6A, and 6B, the three-dimensional semiconductor memory device may include a semiconductor substrate 10, a peripheral circuit structure PS, and a cell array structure CS. The peripheral circuit structure PS and the cell array structure CS may be sequentially stacked on the semiconductor substrate 10, and the peripheral circuit structure PS may be disposed between the semiconductor substrate 10 and the cell array structure CS. The semiconductor substrate 10, the peripheral circuit structure PS, and the cell array structure CS may correspond to the semiconductor substrate 3010, the first structure 3100, and the second structure 3200, respectively, described with reference to FIGS. 3 and 4.

In an example embodiment, the semiconductor substrate 10 may be a silicon substrate, a silicon germanium substrate, a germanium substrate, or a structure including a single-crystalline silicon substrate and a single-crystalline epitaxial layer grown therefrom. The semiconductor substrate 10 may include a cell array region CAR and a connection region CNR.

The peripheral circuit structure PS may be disposed on the semiconductor substrate 10. The peripheral circuit structure PS may correspond to the first region 1100F of FIG. 1. The peripheral circuit structure PS may include a peripheral device isolation layer 11, which is disposed in the semiconductor substrate 10 to define a peripheral active region ACT, peripheral transistors PTR, which are provided on the peripheral active region ACT, peripheral contacts 31 and peripheral lines 32, which are electrically connected to the peripheral transistors PTR, and a peripheral insulating layer 33, which is provided to cover the peripheral transistors PTR, the peripheral contacts 31, and the peripheral lines 32.

The peripheral device isolation layer 11 may be disposed in an upper portion of the semiconductor substrate 10, and may be formed of or include at least one of insulating materials (e.g., silicon oxide). The peripheral active region ACT may be a portion of the semiconductor substrate 10 interposed between adjacent ones of the peripheral device isolation layers 11.

Each of the peripheral transistors PTR may include a peripheral gate insulating layer 21, a peripheral gate electrode 22, a peripheral capping pattern 23, peripheral gate spacers 24 and peripheral source/drain regions 25. The peripheral gate insulating layer 21, the peripheral gate electrode 22, and the peripheral capping pattern 23 may be sequentially stacked on the peripheral active region ACT of the semiconductor substrate 10. The peripheral gate insulating layer 21 may be interposed between the peripheral active region ACT of the semiconductor substrate 10 and the peripheral gate electrode 22, and the peripheral capping pattern 23 may be disposed on the peripheral gate electrode 22. The peripheral gate spacers 24 may be respectively disposed on side surfaces of the peripheral gate electrode 22 and may be extended to cover side surfaces of the peripheral capping pattern 23 and side surfaces of the peripheral gate insulating layer 21. The peripheral source/drain regions 25 may be disposed in portions of the peripheral active region ACT located at both sides of the peripheral gate electrode 22. The peripheral transistors PTR may be NMOS or PMOS transistors and may be fin field effect transistors (FinFET), multi-bridge channel field effect transistors (MBCFET), or gate-all-around (GAA) type transistors.

The peripheral lines 32 may be electrically connected to the peripheral transistors PTR through the peripheral contacts 31. The peripheral lines 32 and the peripheral contacts 31 may be formed of or include at least one of conductive or metallic materials. The peripheral insulating layer 33 may have a multi-layered structure that is composed of a plurality of insulating layers. In an example embodiment, the peripheral insulating layer 33 may be formed of or include at least one of insulating materials (e.g., silicon oxide, silicon nitride, silicon oxynitride, and/or low-k dielectric materials).

The peripheral transistors PTR, the peripheral contacts 31, and the peripheral lines 32 may constitute a peripheral circuit (e.g., the decoder circuit 1110, the page buffer 1120, and the logic circuit 1130 of FIG. 1).

The cell array structure CS may be disposed on the peripheral insulating layer 33 of the peripheral circuit structure PS. The cell array structure CS may include a semiconductor layer 100, a source structure SC, an electrode structure ES, separation structures SS1 and SS2, vertical channel structures VS, vertical dummy structures DVS, cell contact plugs MC, bit lines 220, and conductive connection lines 240. The electrode structure ES and the vertical channel structures VS may constitute the cell strings CSTR of FIG. 1.

The semiconductor layer 100 may be disposed on the peripheral insulating layer 33, and in an example embodiment, the semiconductor layer 100 may be formed of or include at least one of a doped semiconductor material of a first conductivity type (e.g., n-type) and/or an undoped or intrinsic semiconductor material. The semiconductor layer 100 may have at least one of single-crystalline, amorphous, and poly-crystalline structures.

The source structure SC and the electrode structure ES may be sequentially stacked on the semiconductor layer 100. The source structure SC may be disposed between the semiconductor layer 100 and the electrode structure ES. The source structure SC and the electrode structure ES may be disposed on the semiconductor layer 100 on the cell array region CAR and may be extended to a region on the connection region CNR and on the semiconductor layer 100. The source structure SC and the electrode structure ES may be extended in a first direction D1, which is parallel to a top surface of the semiconductor substrate 10.

The source structure SC may constitute the common source line CSL of FIG. 1 and the common source line 3205 of FIGS. 3 and 4. The source structure SC may include a first source conductive pattern SCP1 and a second source conductive pattern SCP2, which are sequentially stacked on the semiconductor layer 100.

The first source conductive pattern SCP1 may include first openings OP1, which are formed on the cell array region CAR to penetrate the first source conductive pattern SCP1, and second openings OP2, which are formed on the connection region CNR to penetrate the first source conductive pattern SCP1. The first openings OP1 may be spaced apart from each other in a second direction D2, which is parallel to the top surface of the semiconductor substrate 10 and is not parallel to the first direction D1, and may have a circular or bar shape, when viewed in a plan view. The second openings OP2 may be spaced apart from each other in the first and second directions D1 and D2 and may have a bar or line shape. In an example embodiment, the second openings OP2 may have a line shape extending in the first direction D1, and may have at least two different lengths in the first direction D1.

The second source conductive pattern SCP2 may be provided to cover a top surface of the first source conductive pattern SCP1, and to fill the first and second openings OP1 and OP2 of the first source conductive pattern SCP1. A top surface of the second source conductive pattern SCP2 may have recessed portions, in the first and second openings OP1 and OP2. The second source conductive pattern SCP2 may be provided to penetrate the first source conductive pattern SCP1 through the first and second openings OP1 and OP2, and may be in contact with the semiconductor layer 100.

The first source conductive pattern SCP1 may be formed of or include a doped semiconductor material of the first conductivity type (e.g., doped with dopants, such as phosphorus (P) or arsenic (As)). As an example, the first source conductive pattern SCP1 may be an n-type doped polysilicon layer. The second source conductive pattern SCP2 may be formed of or include at least one of a doped semiconductor material of the first conductivity type (e.g., n-type) and/or an undoped or intrinsic semiconductor material.

Insulating patterns 105 may be provided on the connection region CNR to penetrate the semiconductor layer 100 and the source structure SC and to define positions, at which the cell contact plugs MC will be provided. Bottom surfaces of the insulating patterns 105 may be in contact with a top surface of the peripheral insulating layer 33. The insulating patterns 105 may be formed of or include at least one of insulating materials (e.g., silicon oxide).

The electrode structure ES may be extended from the cell array region CAR to the connection region CNR in the first direction D1 and may have a stepwise structure on the connection region CNR. The electrode structure ES may include gate electrodes EL and insulating layers 120, which are alternately stacked in a third direction D3 (i.e., vertical direction) perpendicular to the top surface of the semiconductor substrate 10. The lowermost one of the insulating layers 120 may be interposed between the lowermost one of the gate electrodes EL and the source structure SC. The gate electrodes EL may be formed of or include at least one of, e.g., doped semiconductor materials (e.g., doped silicon, etc.), metallic materials (e.g., tungsten, copper, aluminum, etc.), conductive metal nitrides (e.g., titanium nitride, tantalum nitride, etc.), or transition metals (e.g., titanium, tantalum, etc.). The insulating layers 120 may include a silicon oxide layer and/or a low-k dielectric layer. The three-dimensional semiconductor memory device according to an example embodiment may be a vertical-type NAND FLASH memory device. The gate electrodes EL of the electrode structure ES may be used as the word lines WL, the first lines LL1 and LL2, and the second lines UL1 and UL2 of FIG. 1.

The gate electrodes EL and the insulating layers 120 may be extended in the first direction D1, and may have a stepwise structure on the connection region CNR. As a distance from the semiconductor layer 100 in the third direction D3 increases, lengths of the gate electrodes EL in the first direction D1 may decrease. Each of the gate electrodes EL may include a pad portion PAD provided on the connection region CNR. The pad portions PAD of the gate electrodes EL may have a stepwise structure on the connection region CNR. As an example, the pad portions PAD of even-numbered gate electrodes EL of the gate electrodes EL may be provided to form a stepwise structure in the first direction D1, and the pad portions PAD of odd-numbered gate electrodes EL of the gate electrodes EL may be offset from the pad portions PAD of the even-numbered gate electrodes EL in the second direction D2. The pad portions PAD of the odd-numbered gate electrodes EL may be provided to form a stepwise structure in the first direction D1.

The electrode structure ES may further include a horizontal insulating layer 190 conformally covering top and bottom surfaces of each of the gate electrodes EL. The horizontal insulating layer 190 may be interposed between each of the gate electrodes EL and the insulating layers 120 adjacent thereto. The horizontal insulating layer 190 may be formed of or include at least one of high-k dielectric materials (e.g., aluminum oxide and hafnium oxide). The electrode structure ES may further include an insulating separation pattern IP, which is provided on the cell array region CAR to horizontally cut the uppermost one of the gate electrodes EL. The uppermost gate electrodes EL, which are horizontally spaced apart from each other, may be used as the gate electrodes of the second transistors UT1 and UT2 of FIG. 1. The insulating separation pattern IP may be extended from the cell array region CAR in the first direction D1 and may be formed of or include at least one of insulating materials (e.g., silicon oxide).

The separation structures SS1 and SS2 may be disposed on the semiconductor layer 100 to penetrate the electrode structure ES. The separation structures SS1 and SS2 may include first separation structures SS1, which are provided to penetrate the electrode structure ES on the cell array region CAR and are extended in the first direction D1 to penetrate the electrode structure ES on the connection region CNR, and second separation structures SS2, which are provided to penetrate the electrode structure ES on the connection region CNR.

The first separation structures SS1 may be extended from the cell array region CAR to the connection region CNR in the first direction D1 and may be spaced apart from each other in the second direction D2. The insulating separation pattern IP may be disposed on the cell array region CAR and between the first separation structures SS1. The first separation structures SS1 may be provided to penetrate a portion of the second source conductive pattern SCP2 filling the first openings OP1 of the first source conductive pattern SCP1 and may be in contact with the semiconductor layer 100. The second separation structures SS2 may be disposed on the connection region CNR and between the first separation structures SS1. The second separation structures SS2 may be extended in the first direction D1 and may be spaced apart from each other in the first direction D1. In addition, the second separation structures SS2 may be spaced apart from the first separation structures SS1 in the second direction D2.

The pad portions PAD of the even-numbered gate electrodes EL of the gate electrodes EL of the electrode structure ES may be disposed between one of the first separation structures SS1 and the second separation structures SS2. The pad portions PAD of the odd-numbered gate electrodes EL of the gate electrodes EL of the electrode structure ES2 may be disposed between another of the first separation structures SS1 and the second separation structures SS2. The second separation structures SS2 may be disposed between the pad portions PAD of the even-numbered gate electrodes EL and the pad portions PAD of the odd-numbered gate electrodes EL.

Top surfaces of the separation structures SS1 and SS2 may be located at the same height from the semiconductor substrate 10. Each of the separation structures SS1 and SS2 may include an insulating layer covering a side surface of the electrode structure ES, and may further include a conductive layer, and in this case, the insulating layer may be interposed between the side surface of the electrode structure ES and the conductive layer.

The vertical channel structures VS may be disposed on the semiconductor layer 100 and on the cell array region CAR to penetrate the electrode structure ES and the source structure SC. Each of the vertical channel structures VS may be provided to penetrate the electrode structure ES and the source structure SC, and may be extended into the semiconductor layer 100. When viewed in a plan view, the vertical channel structures VS may be arranged in a specific direction or in a zigzag shape. The vertical channel structures VS may be used as channel regions of the first transistors LT1 and LT2, the memory cell transistors MCT, and the second transistors UT1 and UT2 of FIG. 1. The horizontal insulating layer 190 may be interposed between each of the gate electrodes EL and the insulating layer 120 adjacent thereto and may be extended into regions between each of the gate electrodes EL and the vertical channel structures VS.

Referring to FIGS. 6B and 7A, each of the vertical channel structures VS may include a vertical semiconductor pattern SP, a data storage pattern DSP between the vertical semiconductor pattern SP and the electrode structure ES, a gapfill insulating pattern VI enclosed by the vertical semiconductor pattern SP, and a conductive pad CP on the vertical semiconductor pattern SP and the gapfill insulating pattern VI. The vertical semiconductor pattern SP may be interposed between the data storage pattern DSP and the gapfill insulating pattern VI.

The vertical semiconductor pattern SP may be shaped like a pipe with a closed bottom, and may be extended into the semiconductor layer 100 through the electrode structure ES and the source structure SC. The vertical semiconductor pattern SP may be formed of or include at least one of a doped semiconductor material, an undoped or intrinsic semiconductor material, or a polycrystalline semiconductor material. The vertical semiconductor pattern SP may be used as the channel regions of the second transistors UT1 and UT2, the memory cell transistors MCT, and the first transistors LT1 and LT2 of FIG. 1. A portion of an outer side surface of the vertical semiconductor pattern SP may be in contact with the first source conductive pattern SCP1. The first source conductive pattern SCP1 may be interposed between the semiconductor layer 100 and the second source conductive pattern SCP2 and may be in contact with the outer side surface of the vertical semiconductor pattern SP. The first source conductive pattern SCP1 may be extended in the third direction D3 and into a region between the outer side surface of the vertical semiconductor pattern SP and the second source conductive pattern SCP2 and may be in contact with a bottom surface of the data storage pattern DSP. In addition, the first source conductive pattern SCP1 may be extended in an opposite direction of the third direction D3 and into a region between the outer side surface of the vertical semiconductor pattern SP and the semiconductor layer 100 and may be in contact with a top surface of a dummy data storage pattern DSPr.

The data storage pattern DSP may be provided between the vertical semiconductor pattern SP and the electrode structure ES to enclose the side surface of the vertical semiconductor pattern SP. The data storage pattern DSP may have a pipe shape with an opened top and bottom. The bottom surface of the data storage pattern DSP may be located at a height between top and bottom surfaces of the second source conductive pattern SCP2. The data storage pattern DSP may be used as a data storing layer of a NAND FLASH memory device, and may include a tunnel insulating layer TIL, a charge storing layer CL, and a blocking insulating layer BLK, which are interposed between the vertical semiconductor pattern SP and the electrode structure ES. In an example embodiment, the charge storing layer CL may be a trap insulating layer, a floating gate electrode, or an insulating layer including conductive nanodots. The blocking insulating layer BLK may be adjacent to a side surface of the electrode structure ES, and the tunnel insulating layer TIL may be adjacent to the vertical semiconductor pattern SP. The charge storing layer CL may be interposed between the blocking insulating layer BLK and the tunnel insulating layer TIL.

The dummy data storage pattern DSPr may be disposed in the semiconductor layer 100 to be vertically spaced apart from the data storage pattern DSP. The dummy data storage pattern DSPr may have the same layer structure as the data storage pattern DSP.

The gapfill insulating pattern VI may be provided to fill a space enclosed by the vertical semiconductor pattern SP and may be extended into the semiconductor layer 100 through the electrode structure ES and the source structure SC. The gapfill insulating pattern VI may be formed of or include at least one of insulating materials (e.g., silicon oxide).

The conductive pad CP may be disposed on the topmost surfaces of the data storage pattern DSP, the vertical semiconductor pattern SP, and the gapfill insulating pattern VI, and may be electrically connected to the vertical semiconductor pattern SP. The conductive pad CP may be formed of or include at least one of doped semiconductor materials or conductive materials.

Referring back to FIGS. 5, 6A, and 6B, the vertical dummy structures DVS may be disposed on the semiconductor layer 100 and on the connection region CNR to penetrate the electrode structure ES and the source structure SC. The vertical dummy structures DVS may be provided to penetrate the pad portions PAD of the gate electrodes EL of the electrode structure ES. The vertical dummy structures DVS and the vertical channel structures VS may be formed at the same time and may have the same layer structure.

The cell contact plugs MC may penetrate the electrode structure ES on the connection region CNR. The cell contact plugs MC may be respectively provided to penetrate the pad portions PAD of the gate electrodes EL of the electrode structure ES. The cell contact plugs MC may include first cell contact plugs MC1, which are respectively provided to penetrate the pad portions PAD of the odd-numbered gate electrodes EL of the gate electrodes EL, and second cell contact plugs MC2, which are respectively provided to penetrate the pad portions PAD of the even-numbered gate electrodes EL of the gate electrodes EL. The first cell contact plugs MC1 may be spaced apart from each other in the first direction D1, between one of the first separation structures SS1 and the second separation structures SS2, and the second cell contact plugs MC2 may be spaced apart from each other in the first direction D1, between another of the first separation structures SS1 and the second separation structures SS2. The first cell contact plugs MC1 may be spaced apart from the second cell contact plugs MC2 in the second direction D2. The second separation structures SS2 may be extended in the first direction D1, between the first cell contact plugs MC1 and the second cell contact plugs MC2. When viewed in a plan view, the vertical dummy structures DVS may be disposed to enclose each of the cell contact plugs MC.

Referring to FIGS. 6A, 6B, and 7B, each of the cell contact plugs MC may include a vertical portion VP, which is extended in the third direction D3 to penetrate the electrode structure ES, and a horizontal portion HP, which is extended from a side surface of the vertical portion VP in a direction (e.g., the first and second directions D1 and D2) parallel to the top surface of the semiconductor substrate 10. The vertical portion VP may be provided to penetrate the pad portion PAD of a corresponding one of the gate electrodes EL and the electrode structure ES below the pad portion PAD of the corresponding gate electrode EL. The vertical portion VP may penetrate a corresponding one of the insulating patterns 105, which are provided in the source structure SC and the semiconductor layer 100, and may be directly and electrically connected to a corresponding one of the peripheral lines 32. The horizontal portion HP may be horizontally extended onto a top surface of the pad portion PAD of the corresponding gate electrode EL. A bottom surface of the horizontal portion HP may be in contact with the top surface of the pad portion PAD of the corresponding gate electrode EL in a vertical direction (e.g., in the third direction D3). As a result of the vertical contact between the bottom surface of the horizontal portion HP and the top surface of the pad portion PAD of the corresponding gate electrode EL, each of the cell contact plugs MC may be electrically connected to the pad portion PAD of the corresponding gate electrode EL.

A contact barrier layer 195 may enclose a side surface of the vertical portion VP of each of the cell contact plugs MC, and may be extended along top, side, and bottom surfaces of the horizontal portion HP of each of the cell contact plugs MC. The contact barrier layer 195 may be interposed between the bottom surface of the horizontal portion HP and the top surface of the pad portion PAD of the corresponding gate electrode EL. The contact barrier layer 195 may extend to a region below a bottom surface of the vertical portion VP, and may be disposed between the bottom surface of the vertical portion VP and the corresponding peripheral line 32. The contact barrier layer 195 may be formed of or include a conductive material or aluminum oxide.

Blocking patterns 186P may be disposed in the electrode structure ES and below the horizontal portion HP of each of the cell contact plugs MC. The blocking patterns 186P may be disposed between the vertical portion VP of each of the cell contact plugs MC and the pad portion PAD of the corresponding gate electrode EL and between the gate electrodes EL, which are disposed below the pad portion PAD of the corresponding gate electrode EL, and the vertical portion VP. The vertical portion VP of each of the cell contact plugs MC may be horizontally spaced apart from the pad portion PAD of the corresponding gate electrode EL and the gate electrodes EL, which are disposed below the pad portion PAD of the corresponding gate electrode EL, by the blocking patterns 186P. The blocking patterns 186P may be formed of or include at least one of insulating materials (e.g., silicon oxide).

Each of the cell contact plugs MC may be electrically connected to the pad portion PAD of the corresponding gate electrode EL, due to the vertical contact between the bottom surface of the horizontal portion HP and the top surface of the pad portion PAD of the corresponding gate electrode EL, and may be electrically disconnected from the gate electrodes EL, which are disposed below the pad portion PAD of the corresponding gate electrode EL, by the blocking patterns 186P. The corresponding insulating pattern 105 may be interposed between the vertical portion VP of each of the cell contact plugs MC and the source structure SC and between the vertical portion VP of each of the cell contact plugs MC and the semiconductor layer 100. Thus, each of the cell contact plugs MC may be electrically disconnected from the source structure SC and the semiconductor layer 100.

The horizontal portion HP of each of the cell contact plugs MC may be spaced apart from the first and second separation structures SS1 and SS2. As an example, the horizontal portion HP of each of the cell contact plugs MC may be disposed between and horizontally spaced apart from one of the first separation structures SS1 and one of the second separation structures SS2.

The cell array structure CS may further include a sacrificial oxide layer 140, a planarization insulating layer 160, a first upper insulating layer 170, and a second upper insulating layer 200, which are sequentially stacked on the electrode structure ES.

The sacrificial oxide layer 140 may cover a top surface of the electrode structure ES and may cover the stepwise structure of the electrode structure ES on the connection region CNR. The sacrificial oxide layer 140 may conformally cover the pad portions PAD of the gate electrodes EL of the electrode structure ES. The sacrificial oxide layer 140 may be formed of or include at least one of insulating materials (e.g., silicon oxide). The horizontal portion HP of each of the cell contact plugs MC may be provided to penetrate the sacrificial oxide layer 140 and the horizontal insulating layer 190, and may be electrically connected to the top surface of the pad portion PAD of the corresponding gate electrode EL.

The planarization insulating layer 160 may be disposed on the sacrificial oxide layer 140, and may have a substantially flat top surface. The planarization insulating layer 160 may cover upper portions of the vertical channel structures VS and the vertical dummy structures DVS. Top surfaces of the conductive pads CP of the vertical channel structures VS may be substantially coplanar with a top surface of the planarization insulating layer 160 or may be located at substantially the same height as the top surface of the planarization insulating layer 160. The planarization insulating layer 160 may cover the horizontal portions HP of the cell contact plugs MC. The vertical portion VP of each of the cell contact plugs MC may extend from the horizontal portion HP in the third direction D3 to penetrate the planarization insulating layer 160. The contact barrier layer 195 may be interposed between the vertical portion VP of each of the cell contact plugs MC and the planarization insulating layer 160. The planarization insulating layer 160 may be formed of or include at least one of insulating materials (e.g., silicon oxide, silicon nitride, and/or silicon oxynitride), may extend into regions between the horizontal portion HP of each of the cell contact plugs MC and the first and second separation structures SS1 and SS2, and may be in contact with the sacrificial oxide layer 140.

The first upper insulating layer 170 may be disposed on the planarization insulating layer 160 to cover the top surfaces of the conductive pads CP. The vertical portion VP of each of the cell contact plugs MC may be provided to penetrate the first upper insulating layer 170. The contact barrier layer 195 may be extended into a region between the vertical portion VP of each of the cell contact plugs MC and the first upper insulating layer 170. Top surfaces of the cell contact plugs MC (i.e., a top surface of the vertical portion VP of each of the cell contact plugs MC) may be substantially coplanar with a top surface of the first upper insulating layer 170 or may be located at substantially the same height as the top surface of the first upper insulating layer 170.

Each of the first and second separation structures SS1 and SS2 may be extended in the third direction D3 to penetrate the planarization insulating layer 160 and the first upper insulating layer 170. Top surfaces of the first and second separation structures SS1 and SS2 may be substantially coplanar with the top surface of the first upper insulating layer 170 or may be located at substantially the same height as the top surface of the first upper insulating layer 170.

The sacrificial oxide layer 140 may include portions that are partially left between a side surface of the horizontal portion HP of each of the cell contact plugs MC and one of the first separation structures SS1 and between the side surface of the horizontal portion HP of each of the cell contact plugs MC and one of the second separation structures SS2. The planarization insulating layer 160 may be extended into regions between the side surface of the horizontal portion HP of each of the cell contact plugs MC and the one of the first separation structures SS1 and between the side surface of the horizontal portion HP of each of the cell contact plugs MC and the one of the second separation structures SS2. The contact barrier layer 195 may be interposed between the side surface of the horizontal portion HP of each of the cell contact plugs MC and the planarization insulating layer 160, and may be extended to regions between the side surface of the horizontal portion HP of each of the cell contact plugs MC and the sacrificial oxide layer 140 and between the side surface of the horizontal portion HP of each of the cell contact plugs MC and the horizontal insulating layer 190.

The second upper insulating layer 200 may be disposed on the first upper insulating layer 170 to cover the top surfaces of the cell contact plugs MC and the first and second separation structures SS1 and SS2. The first and second upper insulating layer 170 and 200 may be formed of or include at least one of insulating materials (e.g., silicon oxide, silicon nitride, and/or silicon oxynitride).

Referring back to FIGS. 5, 6A, and 6B, the bit lines 220 and the conductive connection lines 240 may be disposed on the second upper insulating layer 200. The bit lines 220 may be extended in the second direction D2, on the cell array region CAR, and may be spaced apart from each other in the first direction D1. Each of the vertical channel structures VS may be electrically connected to a corresponding one of the bit lines 220. The conductive connection lines 240 may be extended in the second direction D2, on the connection region CAR, and may be spaced apart from each other in the first direction D1. Each of the cell contact plugs MC may be electrically connected to a corresponding one of the conductive connection lines 240.

The cell array structure CS may further include bit line contacts 210, which are provided to connect the vertical channel structures VS to the bit lines BL, and connection contacts 230, which are provided to connect the cell contact plugs MC to the conductive connection lines 240. The bit line contacts 210 may be provided to penetrate the first and second upper insulating layers 170 and 200 on the cell array region CAR, and to electrically connect the vertical channel structures VS to the bit lines BL. The connection contacts 230 may be provided to penetrate the second upper insulating layer 200 on the connection region CNR, and to electrically connect the cell contact plugs MC to the conductive connection lines 240. The bit line contacts 210, the bit lines 220, the connection contacts 230, and the conductive connection lines 240 may be formed of or include at least one of conductive or metallic materials.

FIGS. 8A to 15A are sectional views, which are taken along the line A-A' of FIG. 5 to illustrate a method of fabricating a three-dimensional semiconductor memory device according to an example embodiment. FIGS. 8B to 15B are sectional views illustrating a method of fabricating a three-dimensional semiconductor memory device according to an example embodiment and in particular corresponding to the lines B-B' and C-C' of FIG. 5. For concise description, an element in the three-dimensional semiconductor memory device previously described with reference to FIGS. 5, 6A, 6B, 7A, and 7B may be identified by the same reference number without repeating an overlapping description thereof.

Figure 8A:
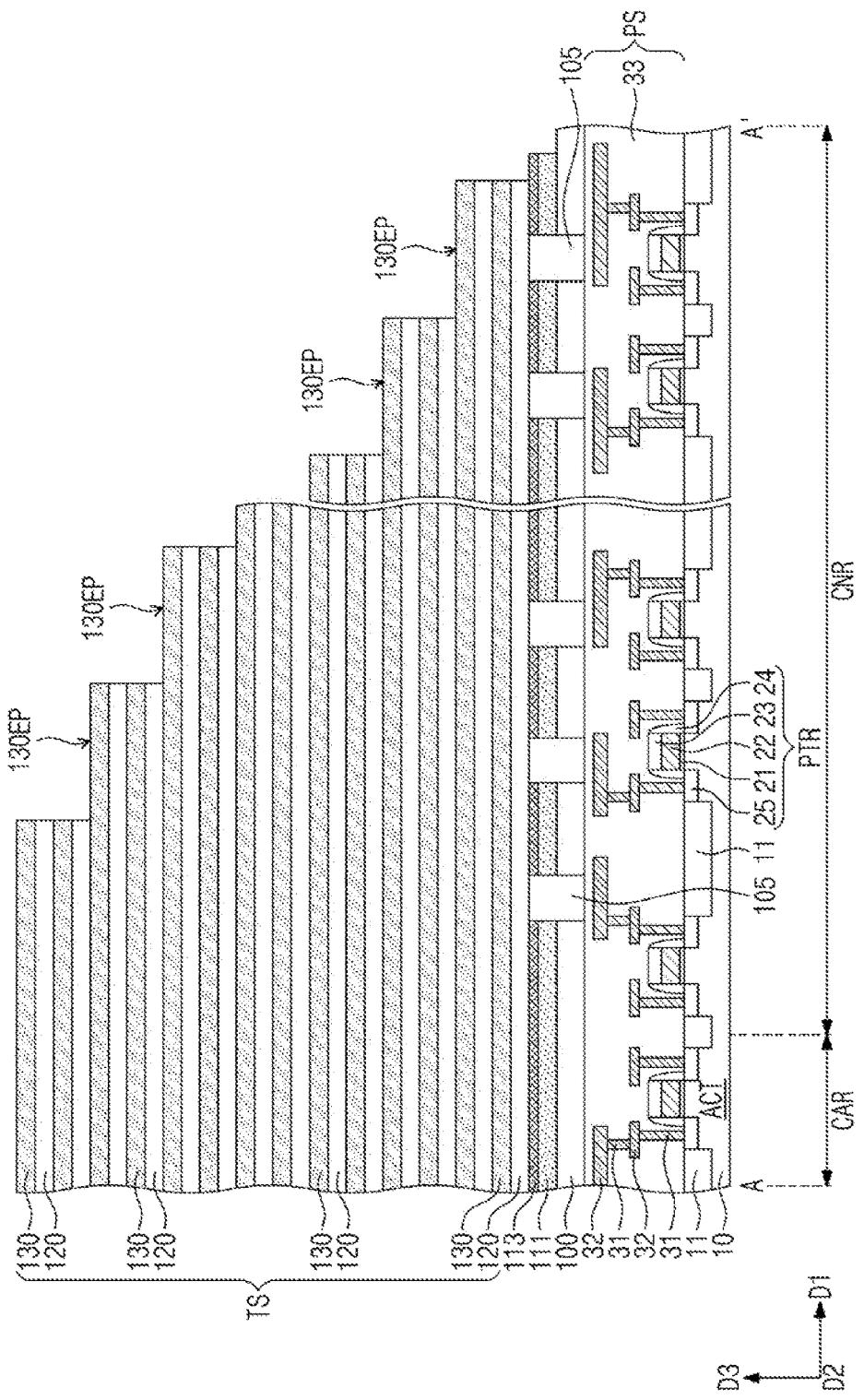
Figure 8B:
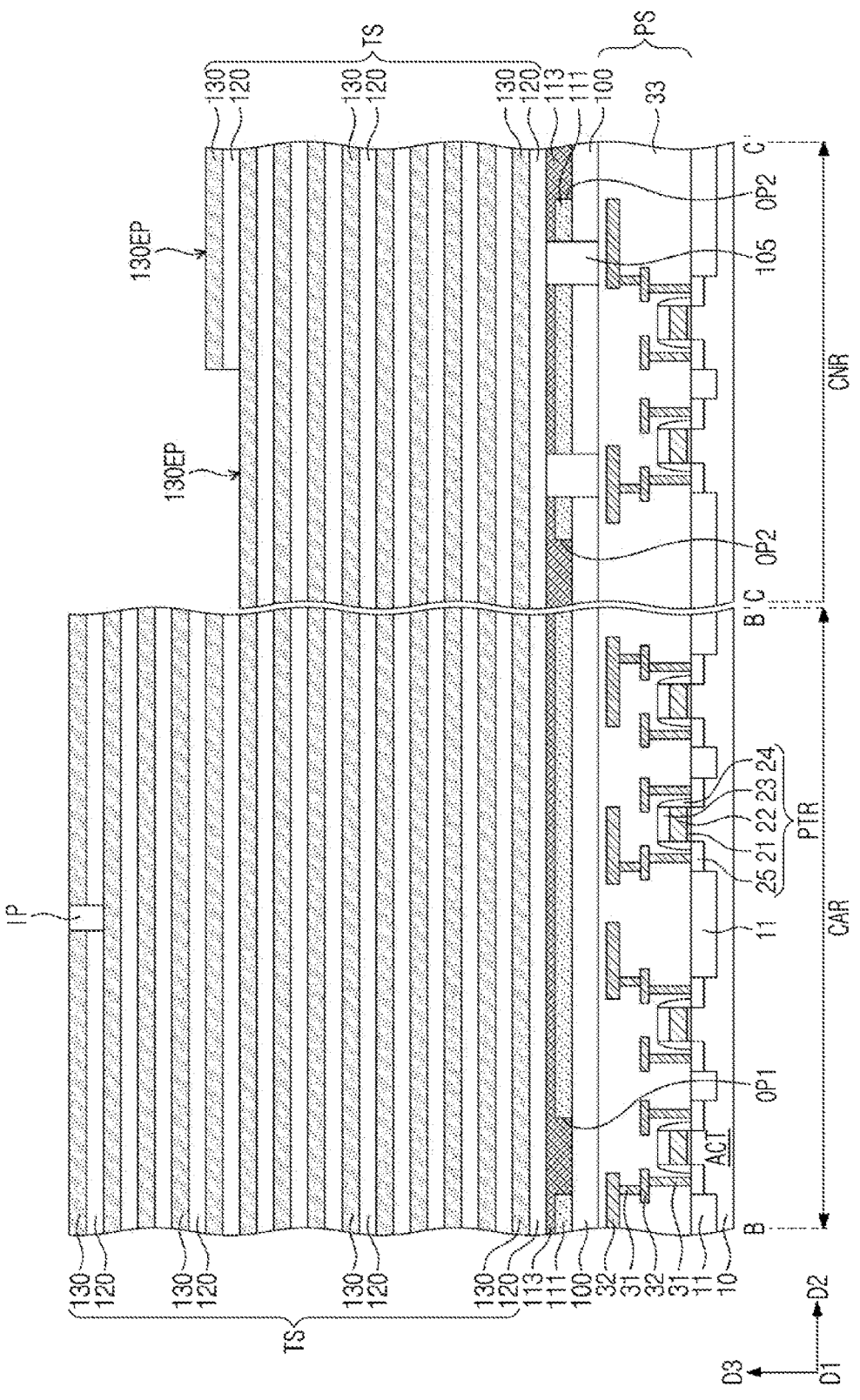

Referring to FIGS. 8A and 8B, a semiconductor substrate 10 including a cell array region CAR and a connection region CNR may be provided. A peripheral circuit structure PS may be formed on the semiconductor substrate 10. The formation of the peripheral circuit structure PS may include forming a peripheral device isolation layer 11 in the semiconductor substrate 10 to define a peripheral active region ACT, forming peripheral transistors PTR on the peripheral active region ACT, forming peripheral contacts 31 and peripheral lines 32, which are electrically connected to the peripheral transistors PTR, and forming a peripheral insulating layer 33 on the semiconductor substrate 10 to cover the peripheral transistors PTR, the peripheral contacts 31, and the peripheral lines 32.

A semiconductor layer 100 may be formed on the peripheral insulating layer 33. A lower sacrificial layer 111 and a lower semiconductor layer 113 may be formed on the semiconductor layer 100. The lower sacrificial layer 111 may be formed to have a multi-layered structure including at least one of a silicon oxide layer, a silicon nitride layer, a silicon oxynitride layer, a silicon carbide layer, or a silicon germanium layer. First openings OP1 and second openings OP2 may be formed in the lower sacrificial layer 111. The first openings OP1 may be formed on the cell array region CAR to penetrate the lower sacrificial layer 111, and to expose a portion of the semiconductor layer 100. The second openings OP2 may be formed on the connection region CNR to penetrate the lower sacrificial layer 111, and to expose another portion of the semiconductor layer 100. After the formation of the first and second openings OP1 and OP2, the lower semiconductor layer 113 may be deposited on the lower sacrificial layer 111 to have a uniform thickness. The lower semiconductor layer 113 may fill the first and second openings OP1 and OP2, and may contact the semiconductor layer 100. The lower semiconductor layer 113 may be formed of or include at least one of a doped semiconductor material of a first conductivity type (e.g., n-type) and/or an undoped or intrinsic semiconductor material.

Insulating patterns 105 may be formed on the connection region CNR to penetrate the semiconductor layer 100, the lower sacrificial layer 111, and the lower semiconductor layer 113. In an example embodiment, the formation of the insulating patterns 105 may include forming holes on the connection region CNR to penetrate the semiconductor layer 100, the lower sacrificial layer 111, and the lower semiconductor layer 113, and to expose the peripheral insulating layer 33, forming a lower insulating layer on the lower semiconductor layer 113 to fill the holes, and planarizing the lower insulating layer to expose a top surface of the lower semiconductor layer 113. The planarization may be performed using, e.g., a chemical mechanical polishing (CMP) process or an etch-back process.

A mold structure TS may be formed on the lower semiconductor layer 113. The formation of the mold structure TS may include alternately stacking insulating layers 120 and sacrificial layers 130 on the lower semiconductor layer 113 in the third direction D3, and patterning the insulating and sacrificial layers 120 and 130 to form a stepwise structure on the connection region CNR. Since the mold structure TS has the stepwise structure on the connection region CNR, end portions 130EP of the sacrificial layers 130 on the connection region CNR may not be covered with the insulating layers 120, and may be exposed to the outside of the mold structure TS. The sacrificial layers 130 may be formed of or include a material having an etch selectivity with respect to the insulating layers 120. As an example, the sacrificial layers 130 may include a silicon nitride layer, and the insulating layers 120 may include a silicon oxide layer.

An insulating separation pattern IP may be formed in the mold structure TS on the cell array region CAR, and may penetrate the uppermost one of the sacrificial layers 130 and may be extended in the first direction D1, on the cell array region CAR.

Figure 9A:
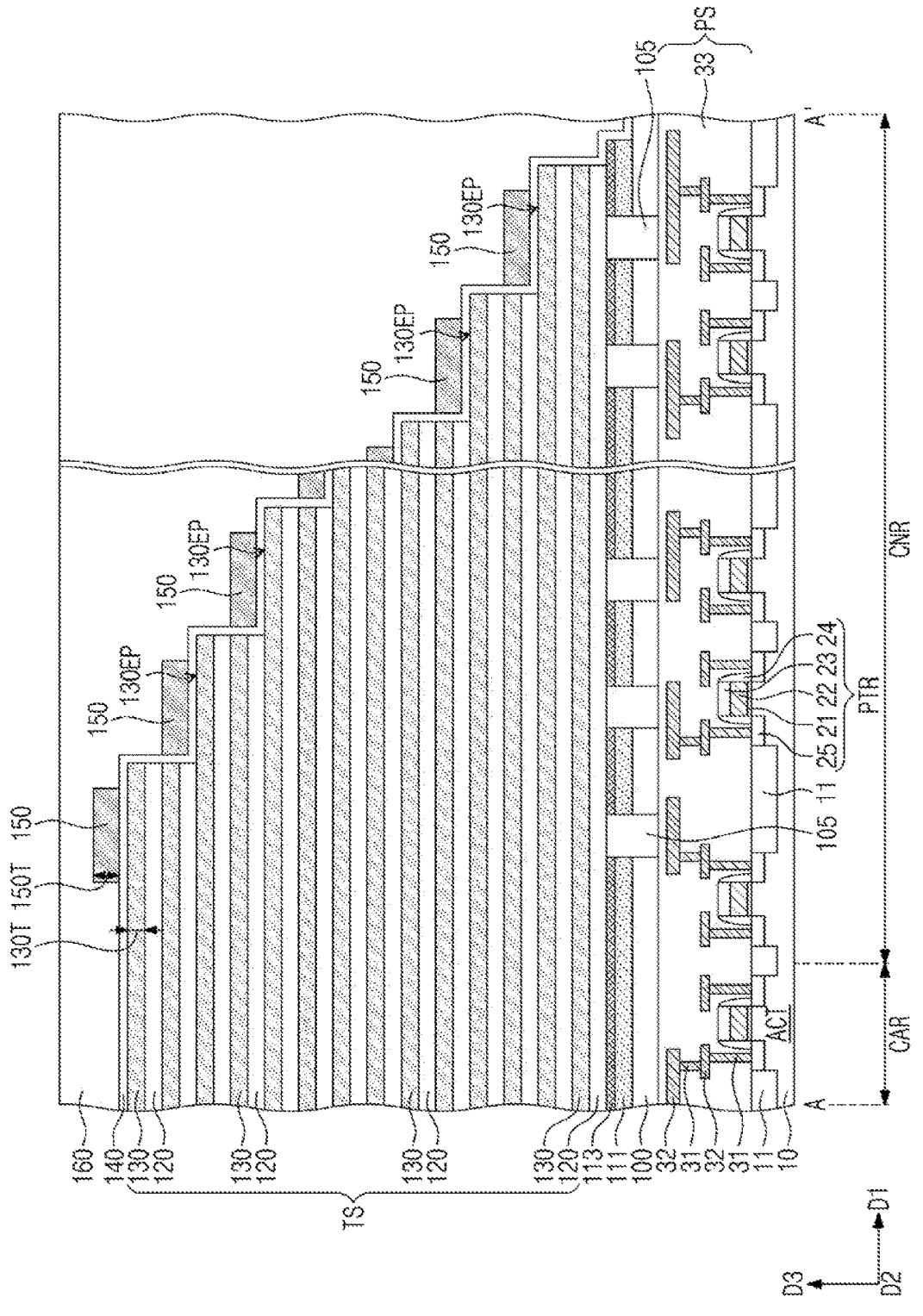
Figure 9B:
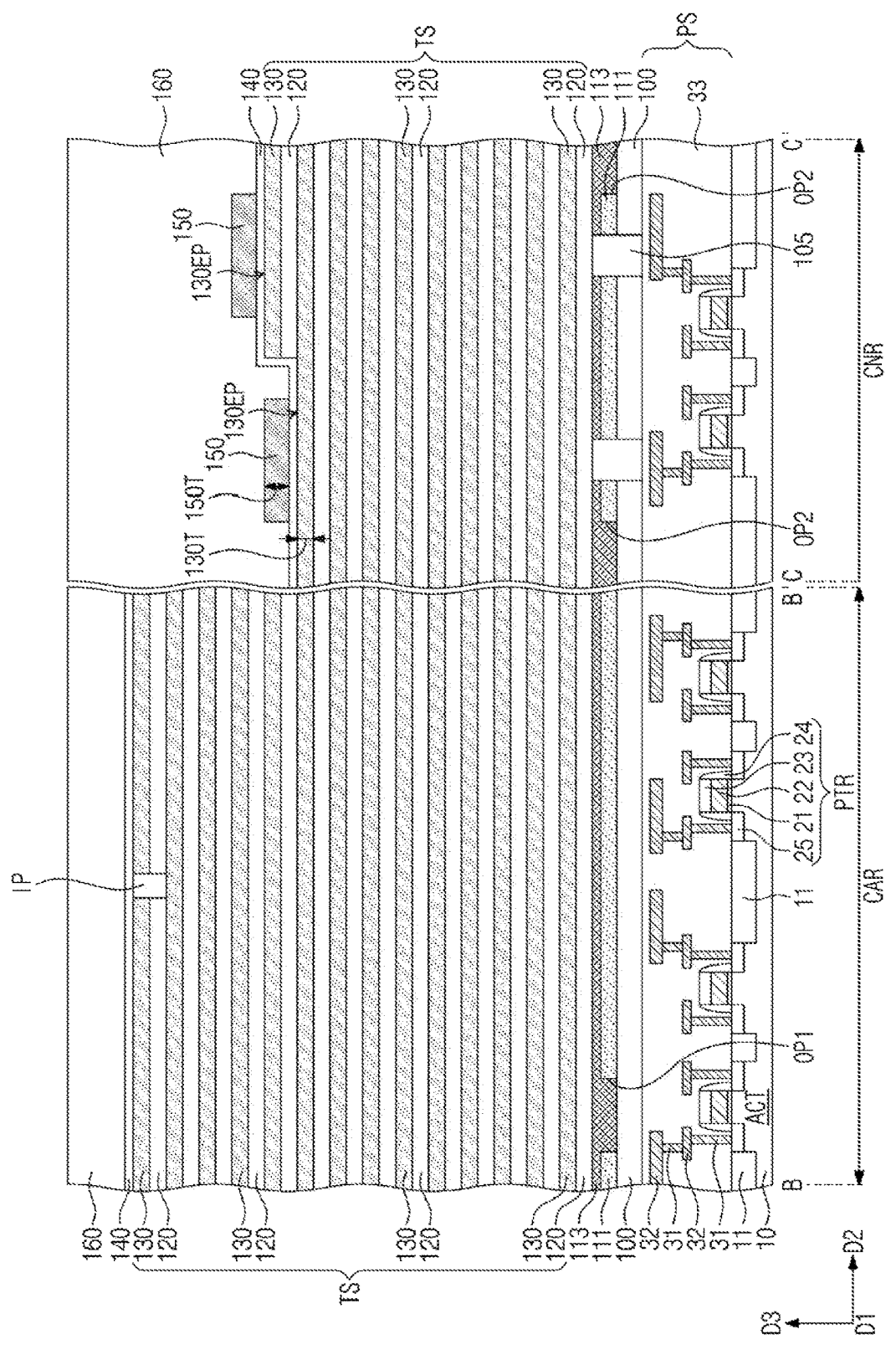

Referring to FIGS. 9A and 9B, a sacrificial oxide layer 140 may be formed to conformally cover top surfaces of the mold structure TS and the insulating separation pattern IP and a stepwise side surface of the mold structure TS on the connection region CNR. The sacrificial oxide layer 140 may conformally cover the uppermost one of the sacrificial layers 130 and the exposed end portions 130EP of the sacrificial layers 130. In an example embodiment, the sacrificial oxide layer 140 may be formed by a chemical vapor deposition process or a physical vapor deposition process.

Sacrificial pad patterns 150 may be respectively formed on the uppermost sacrificial layer 130 of the connection region CNR and on the exposed end portions 130EP of the sacrificial layers 130. The sacrificial oxide layer 140 may be interposed between the uppermost sacrificial layer 130 and a corresponding one of the sacrificial pad patterns 150 and between the exposed end portions 130EP of the sacrificial layers 130 and a corresponding one of the sacrificial pad patterns 150. In an example embodiment, the formation of the sacrificial pad patterns 150 may include forming a sacrificial pad layer on the sacrificial oxide layer 140 to conformally cover the top surface of the mold structure TS and the stepwise side surface of the mold structure TS, and patterning the sacrificial pad layer using an etching process (e.g., a reactive ion etching process or an ion beam etching process). As a result of the etching process on the sacrificial pad layer, the sacrificial pad patterns 150 may be formed.

The sacrificial pad patterns 150 may be formed of or include a material that can be etched at an etch rate higher than the sacrificial layers 130. As an example, the sacrificial pad patterns 150 may be formed of or include silicon nitride, and here, the etch rate of the sacrificial pad patterns 150 may be higher than the etch rate of the sacrificial layers 130. A thickness 150T of each of the sacrificial pad patterns 150 in the third direction D3 may be larger than a thickness 130T of each of the sacrificial layers 130 in the third direction D3.

A planarization insulating layer 160 may be formed on the cell array region CAR and the connection region CNR to cover the mold structure TS, the sacrificial oxide layer 140, and the sacrificial pad patterns 150. A height of a top surface of the planarization insulating layer 160 on the cell array region CAR may be substantially equal to a height of a top surface of the planarization insulating layer 160 on the connection region CNR.

Figure 10A:
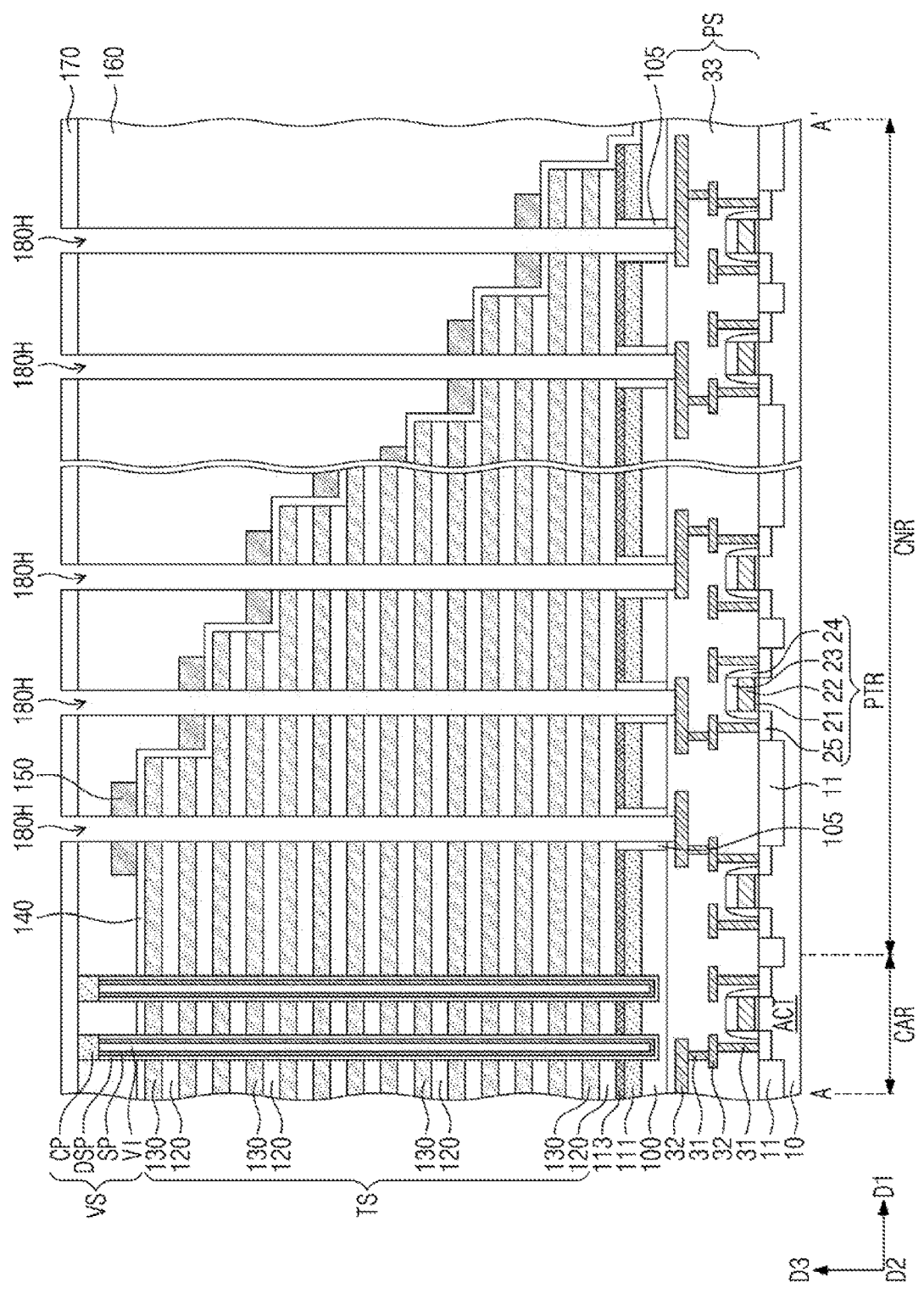
Figure 10B:
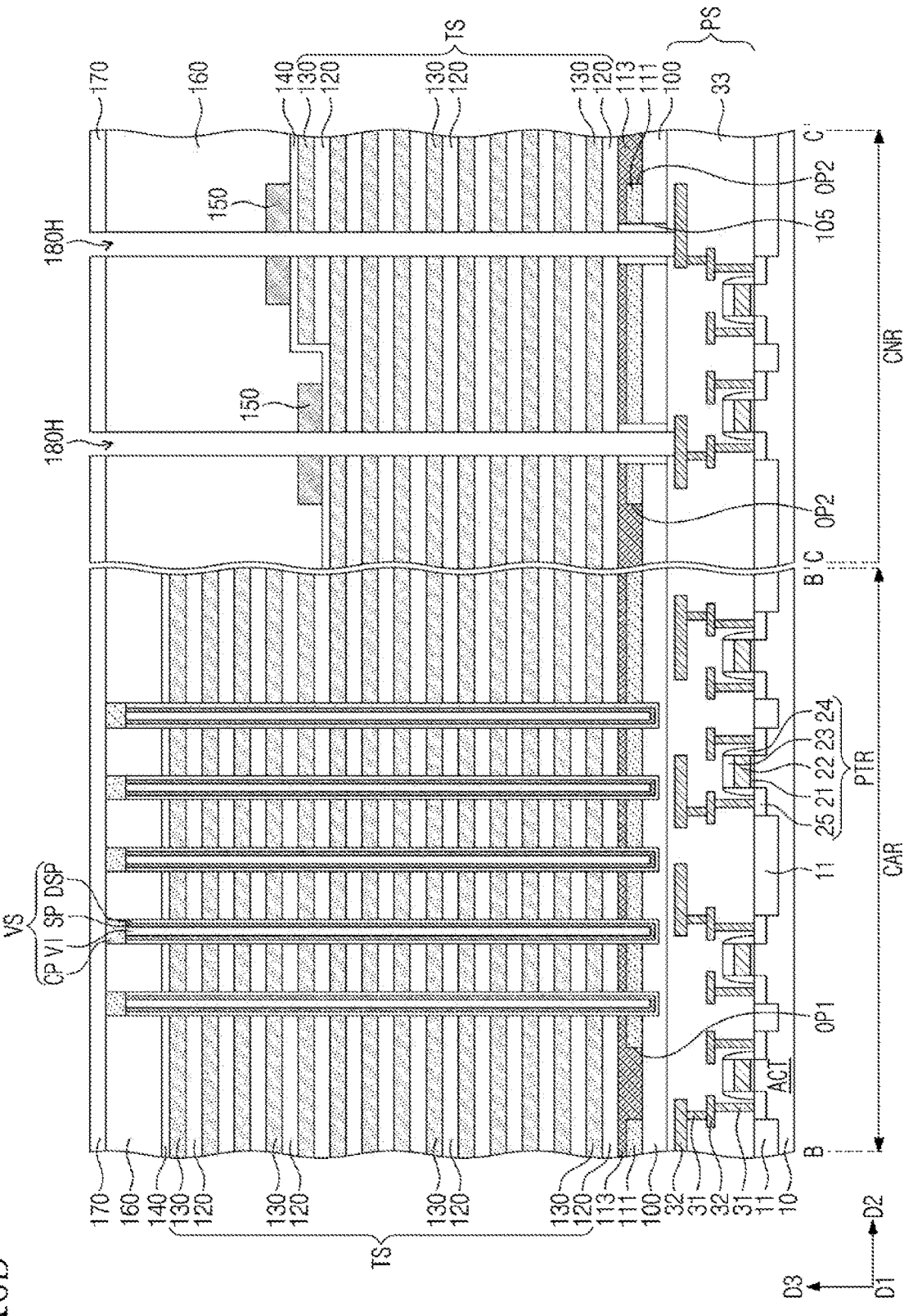

Referring to FIGS. 10A and 10B, vertical channel structures VS may be formed on the semiconductor layer 100 and on the cell array region CAR. Each of the vertical channel structures VS may be provided to penetrate the planarization insulating layer 160, the sacrificial oxide layer 140, and the mold structure TS on the cell array region CAR and may be extended into the semiconductor layer 100. At least one of the vertical channel structures VS may be provided to penetrate the insulating separation pattern IP. In an example embodiment, the formation of the vertical channel structures VS may include forming vertical channel holes to penetrate the planarization insulating layer 160, the sacrificial oxide layer 140, and the mold structure TS, and to expose semiconductor layer 100, forming a data storage pattern DSP to conformally cover an inner surface of each of the vertical channel holes, forming vertical semiconductor pattern SP on the data storage pattern DSP to be conformally extended along the inner surface of each of the vertical channel holes, forming a gapfill insulating pattern VI on the vertical semiconductor pattern SP to fill an inner space of each of the vertical channel holes, and forming a conductive pad CP in each of the vertical channel holes to cover the topmost surfaces of the data storage pattern DSP, the vertical semiconductor pattern SP, and the gapfill insulating pattern VI. A top surface of the conductive pad CP may be formed at substantially the same height as a top surface of the planarization insulating layer 160.

A first upper insulating layer 170 may be formed on the cell array region CAR and the connection region CNR and on the planarization insulating layer 160, and may cover the top surface of the conductive pad CP of each of the vertical channel structures VS.

Vertical contact holes 180H may be formed to penetrate the mold structure TS on the connection region CNR. The vertical contact holes 180H may penetrate the first upper insulating layer 170 and the planarization insulating layer 160, and may penetrate the sacrificial pad patterns 150, respectively. The vertical contact holes 180H may penetrate the sacrificial oxide layer 140 and the mold structure TS below the sacrificial pad patterns 150, and may penetrate the insulating patterns 105, respectively. The vertical contact holes 180H may be extended into the peripheral insulating layer 33 to expose a corresponding one of the peripheral lines 32. In an example embodiment, the formation of the vertical contact holes 180H may include forming a mask layer on the first upper insulating layer 170 to define regions, in which the vertical contact holes 180H will be formed, and anisotropically etching the first upper insulating layer 170, the planarization insulating layer 160, the sacrificial pad patterns 150, the sacrificial oxide layer 140, the mold structure TS, and the insulating patterns 105 using the mask layer as an etch mask.

Each of the vertical contact holes 180H may be formed to expose an inner side surface of each of the sacrificial pad patterns 150 and to expose inner side surfaces of the sacrificial layers 130 in the mold structure TS.

Figure 11A:
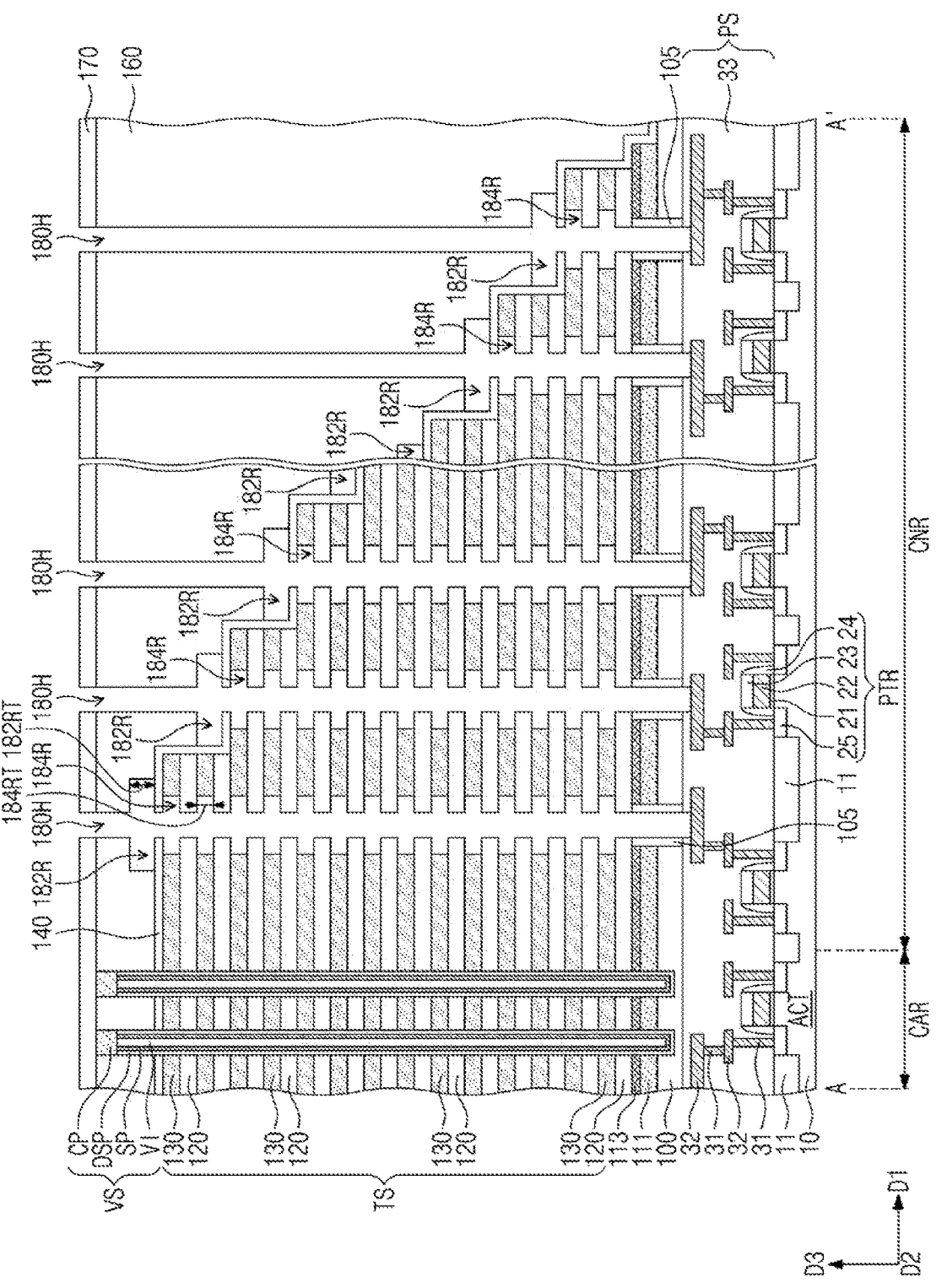
Figure 11B:
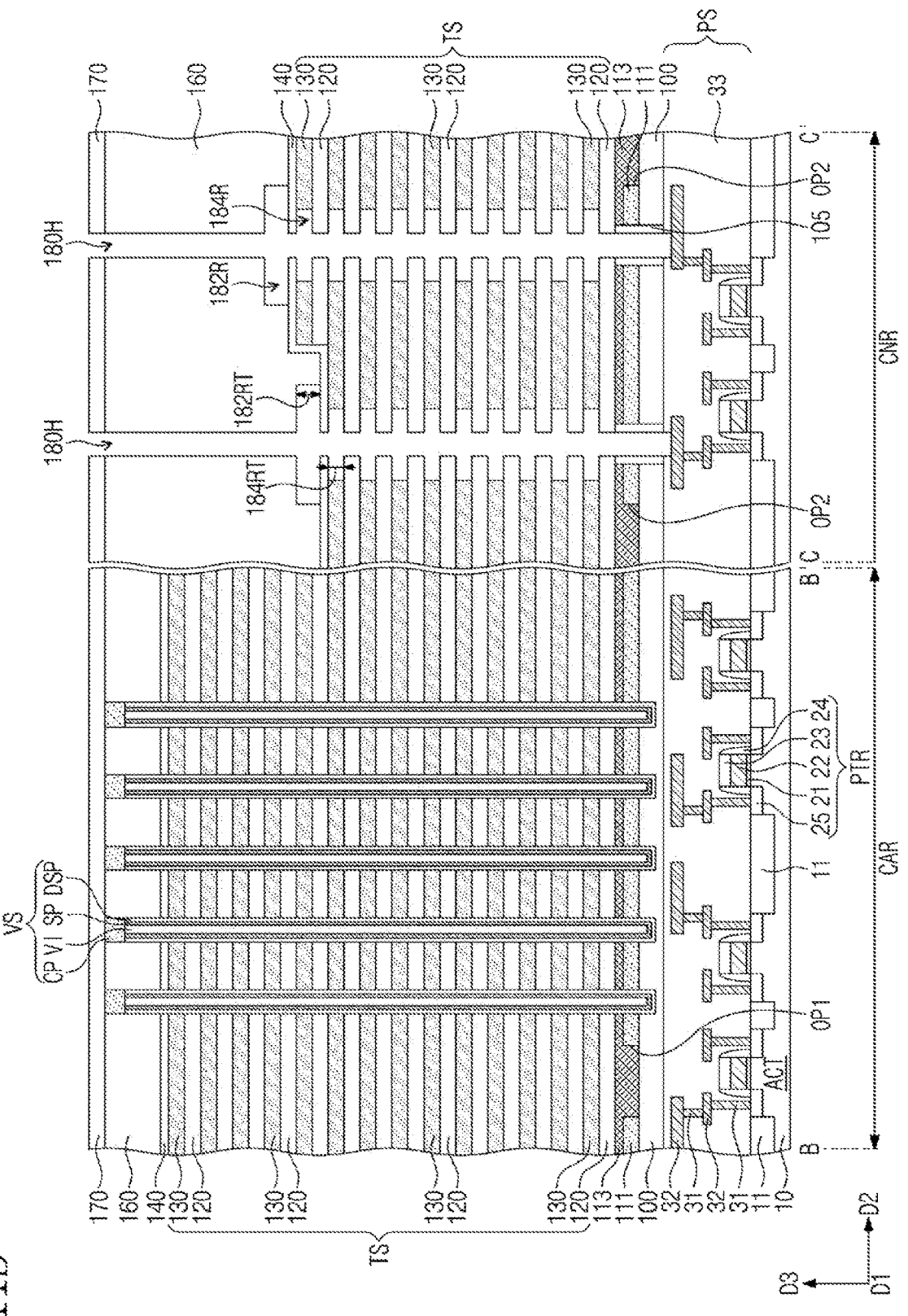

Referring to FIGS. 11A and 11B, the sacrificial pad patterns 150 may be removed through the vertical contact holes 180H, and as a result, first horizontal recess regions 182R may be formed. In an example embodiment, the formation of the first horizontal recess regions 182R may include performing a first etching process to remove or etch the sacrificial pad patterns 150. The first horizontal recess regions 182R may be respectively formed on the uppermost sacrificial layer 130 and on the exposed end portions 130EP of the sacrificial layers 130. The vertical contact holes 180H may be connected to the first horizontal recess regions 182R, respectively. Each of the first horizontal recess regions 182R may be extended from each of the vertical contact holes 180H laterally or horizontally (e.g., in the first and second directions D1 and D2).

The inner side surfaces of the sacrificial layers 130, which are exposed by each of the vertical contact holes 180H, may be recessed. As a result, second horizontal recess regions 184R may be formed. In an example embodiment, the formation of the second horizontal recess regions 184R may include recessing the inner side surfaces of the sacrificial layers 130 through the first etching process. The second horizontal recess regions 184R may be formed in the mold structure TS and between the insulating layers 120. Remaining portions of the sacrificial layers 130 may be left between the insulating layers 120 and may have inner side surfaces that are exposed by the second horizontal recess regions 184R. Each of the vertical contact holes 180H may be connected to the second horizontal recess regions 184R. Each of the second horizontal recess regions 184R may be laterally or horizontally extended from each of the vertical contact holes 180H (e.g., in the first and second directions D1 and D2).

The first and second horizontal recess regions 182R and 184R may be formed simultaneously by the first etching process. The formation of the first and second horizontal recess regions 182R and 184R may include removing the sacrificial pad patterns 150 and recessing the inner side surfaces of the sacrificial layers 130, using the first etching process (e.g., wet etching process). In this case, during the first etching process, an etch rate of the sacrificial pad patterns 150 may be higher than an etch rate of the sacrificial layers 130. Thus, the sacrificial pad patterns 150 may be removed by the first etching process. Portions of the sacrificial layers 130 may remain between the insulating layers 120 after the first etching process.

Since the thickness 150T of each of the sacrificial pad patterns 150 in the third direction D3 is larger than the thickness 130T of each of the sacrificial layers 130 in the third direction D3, a width 182RT of each of the first horizontal recess regions 182R in the third direction D3 may be larger than a width 184RT of each of the second horizontal recess regions 184R in the third direction D3.

Figure 12A:
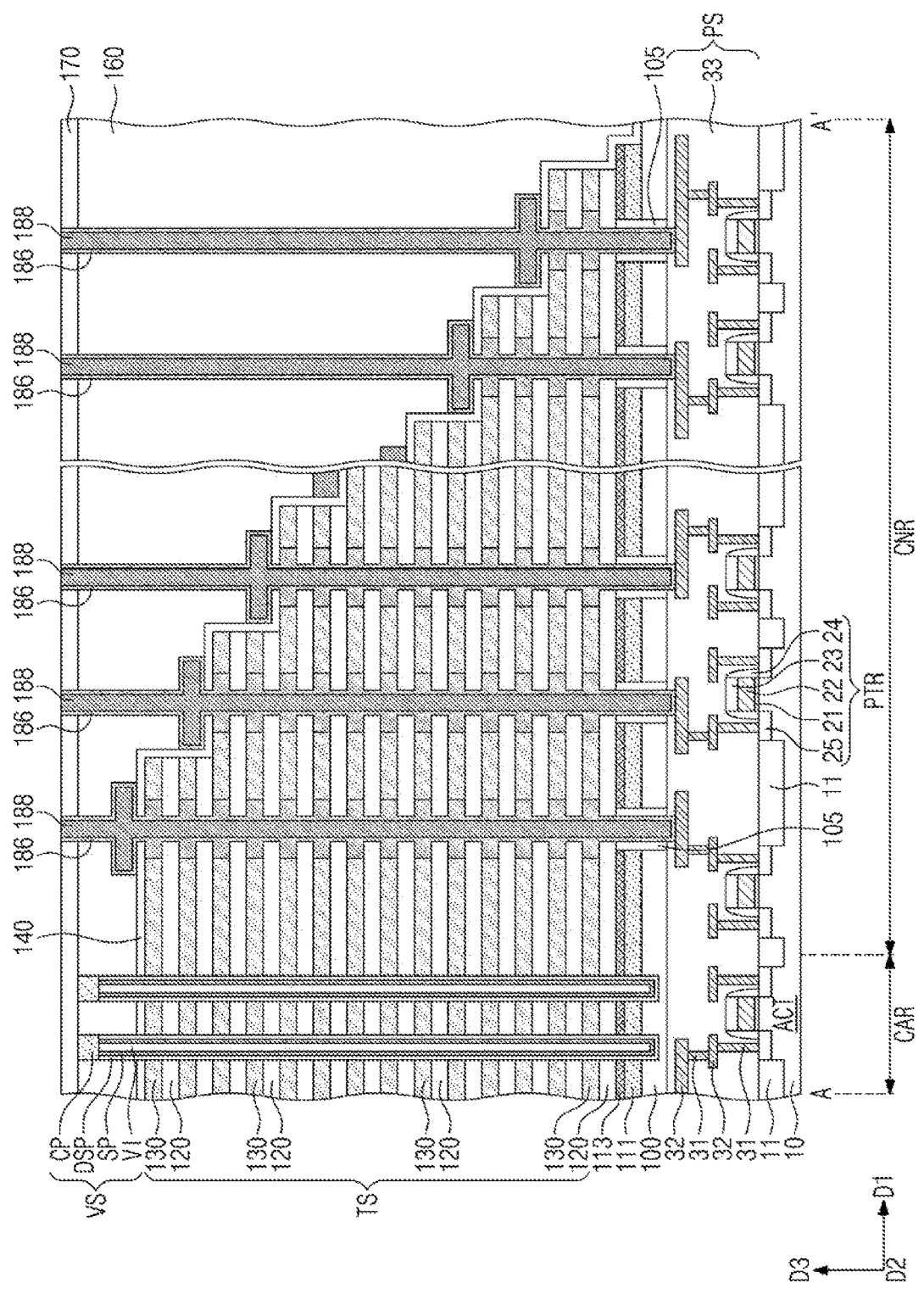
Figure 12B:
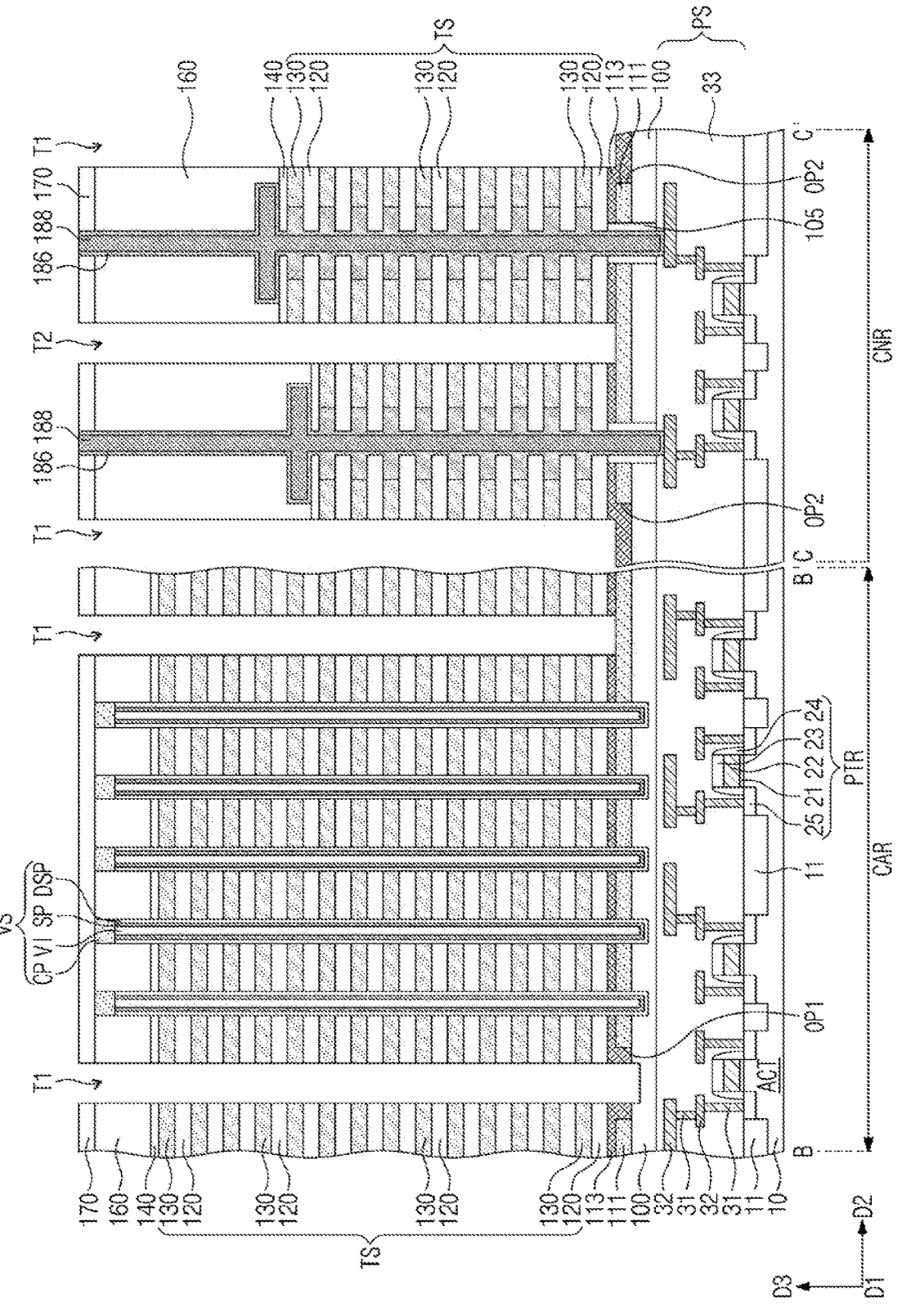

Referring to FIGS. 12A and 12B, a blocking layer 186 may be formed to conformally cover an inner surface of each of the vertical contact holes 180H and an inner surface of each of the first horizontal recess regions 182R and to fill the second horizontal recess regions 184R. Since the width 184RT of each of the second horizontal recess regions 184R in the third direction D3 is smaller than the width 182RT of each of the first horizontal recess regions 182R in the third direction D3, the blocking layer 186 may partially fill each of the first horizontal recess regions 182R and may fill the second horizontal recess regions 184R. The blocking layer 186 may be formed of or include at least one of insulating materials (e.g., silicon oxide).

A sacrificial poly layer 188 may be formed to fill a remaining portion of each of the vertical contact holes 180H and a remaining portion of each of the first horizontal recess regions 182R. For example, the sacrificial poly layer 188 may be formed of or include polysilicon. In an example embodiment, the formation of the blocking layer 186 and the sacrificial poly layer 188 may include forming the blocking layer 186 on the first upper insulating layer 170 to conformally cover the inner surface of each of the vertical contact holes 180H and the inner surface of each of the first horizontal recess regions 182R and to fill the second horizontal recess regions 184R, forming the sacrificial poly layer 188 to fill the remaining portion of each of the vertical contact holes 180H and the remaining portion of each of the first horizontal recess regions 182R, and planarizing the blocking layer 186 and the sacrificial poly layer 188 to expose a top surface of the first upper insulating layer 170. The planarization may be performed using, e.g., a chemical mechanical polishing (CMP) process or an etch-back process.

First separation trenches T1 may be formed on the cell array region CAR to penetrate the mold structure TS. The first separation trenches T1 may be extended in the first direction D1, and may be spaced apart from each other in the second direction D2. The first separation trenches T1 may be extended in the first direction D1 to penetrate the mold structure TS on the connection region CNR. Each of the first separation trenches T1 may penetrate the sacrificial oxide layer 140, the planarization insulating layer 160, and the first upper insulating layer 170 on the mold structure TS. Each of the first separation trenches T1 may be formed to penetrate the lower semiconductor layer 113 filling each of the first openings OP1 and to expose the semiconductor layer 100. The vertical channel structures VS and the insulating separation pattern IP may be disposed on the cell array region CAR and between the first separation trenches T1.

Second separation trenches T2 may be formed on the connection region CNR to penetrate the mold structure TS. The second separation trenches T2 may be formed on the connection region CNR and between the first separation trenches T1. The second separation trenches T2 may be extended in the first direction D1, and may be spaced apart from each other in the first direction D1. The second separation trenches T2 may be spaced apart from the first separation trenches T1 in the second direction D2.

A height of the uppermost sacrificial layer 130 of the mold structure TS between one of the first separation trenches T1 and the second separation trenches T2 may be different from a height of the uppermost sacrificial layer 130 of the mold structure TS between another of the first separation trenches T1 and the second separation trenches T2. The vertical contact holes 180H may be disposed on the connection region CNR, and between each of the first separation trenches T1 and the second separation trenches T2. Each of the first horizontal recess regions 182R may extend from each of the vertical contact holes 180H laterally or horizontally (e.g., in the first and second directions D1 and D2), may be disposed between each of the first separation trenches T1 and the second separation trenches T2, and may be horizontally spaced apart from each of the first separation trenches T1 and the second separation trenches T2.

Each of the first and second separation trenches T1 and T2 may expose inner side surfaces of the insulating and sacrificial layers 120 and 130 in the mold structure TS, and may expose a top surface of the lower sacrificial layer 111.

Figure 13A:
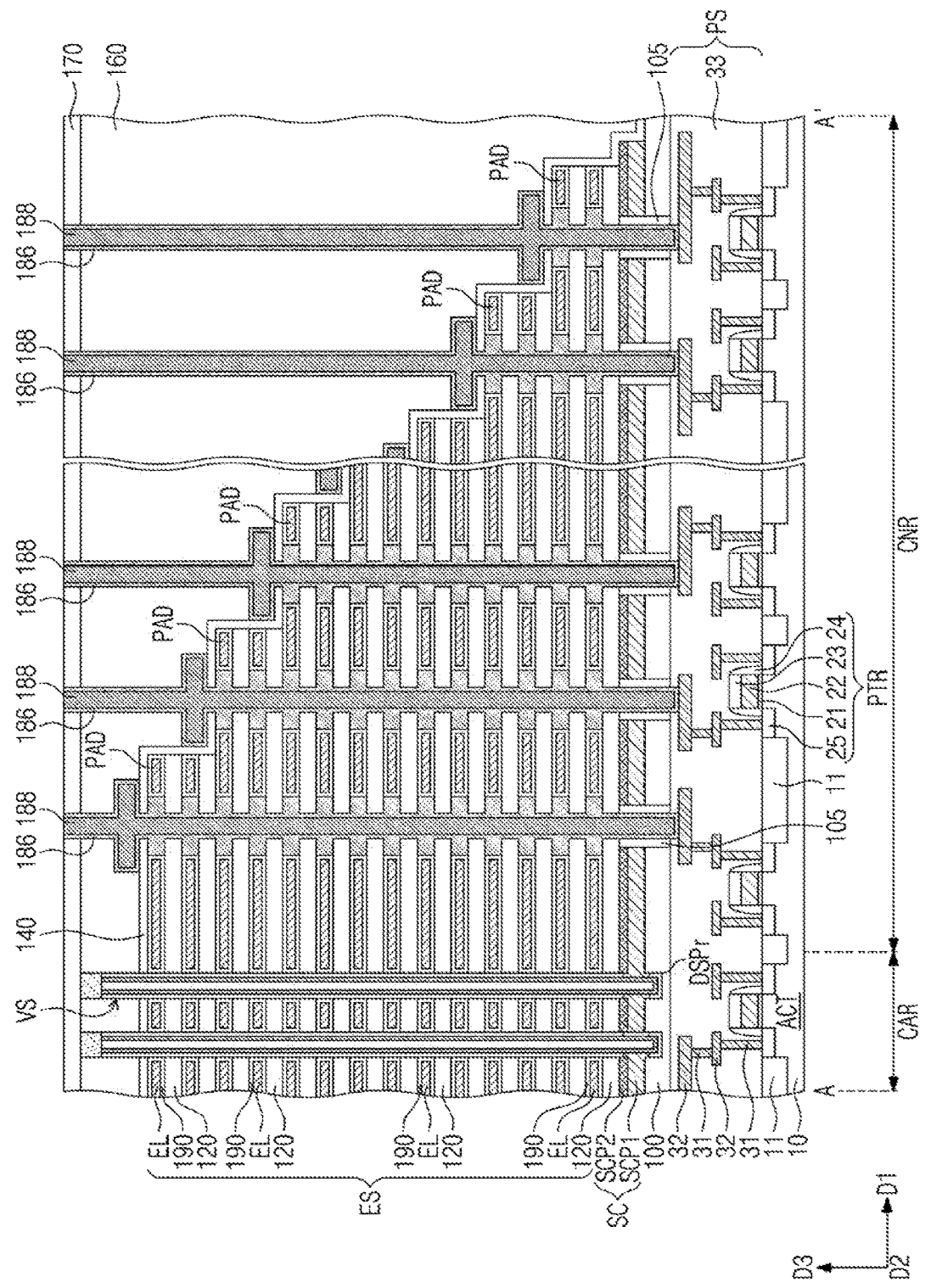
Figure 13B:
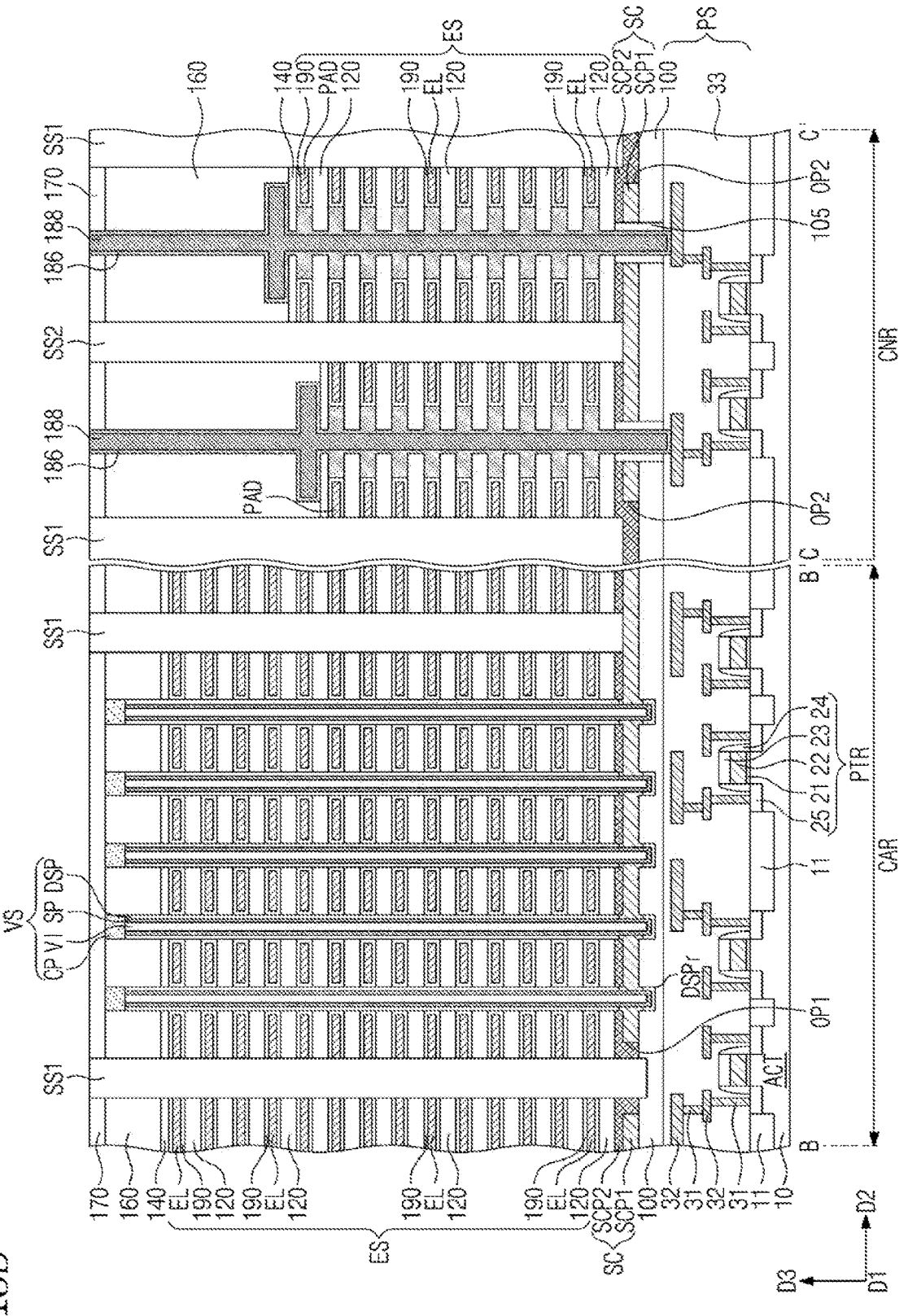

Referring to FIGS. 13A and 13B, the lower sacrificial layer 111, which is exposed by the first and second separation trenches T1 and T2, may be removed. Thus, a lower empty region may be formed below a lower semiconductor layer 113. During the removal of the lower sacrificial layer 111, a portion of the data storage pattern DSP may be removed, and thus, the lower empty region may expose an outer side surface of the vertical semiconductor pattern SP of each of the vertical channel structures VS. The lower empty region may be extended into a region between the outer side surface of the vertical semiconductor pattern SP and the lower semiconductor layer 113 in the third direction D3, and may be extended into a region between the outer side surface of the vertical semiconductor pattern SP and the semiconductor layer 100 in an opposite direction of the third direction D3. Since the portion of the data storage pattern DSP is removed, another portion of the data storage pattern DSP may be left in the semiconductor layer 100 and may be referred to as a dummy data storage pattern DSPr. The data storage pattern DSP and the dummy data storage pattern DSPr may be spaced apart from each other in the third direction D3.

A first source conductive pattern SCP1 may be formed to fill the lower empty region. In an example embodiment, the formation of the first source conductive pattern SCP1 may include forming a source conductive layer to fill a portion of each of the first and second separation trenches T1 and T2 and to fill the lower empty region and removing the source conductive layer from the first and second separation trenches T1 and T2. The first source conductive pattern SCP1 may be in contact with the outer side surface of the vertical semiconductor pattern SP. The lower semiconductor layer 113 may be referred to as a second source conductive pattern SCP2. The first source conductive pattern SCP1 may be extended in the third direction D3 and into a region between the outer side surface of the vertical semiconductor pattern SP and the second source conductive pattern SCP2, and may be in contact with a bottom surface of the data storage pattern DSP. In addition, the first source conductive pattern SCP1 may be extended in an opposite direction of the third direction D3 and into a region between the outer side surface of the vertical semiconductor pattern SP and the semiconductor layer 100, and may be in contact with a top surface of the dummy data storage pattern DSPr. The first source conductive pattern SCP1 and the second source conductive pattern SCP2 may constitute a source structure SC.

The sacrificial layers 130, which are exposed by the first and second separation trenches T1 and T2, may be removed, and thus, empty regions may be formed between the insulating layers 120 in the mold structure TS. Gate electrodes EL and horizontal insulating layers 190 may be formed to fill the empty regions. In an example embodiment, the formation of the gate electrodes EL and the horizontal insulating layers 190 may include forming the horizontal insulating layers 190 to conformally cover an inner surface of each of the first and second separation trenches T1 and T2 and the empty regions, forming a gate electrode layer to fill a portion of each of the first and second separation trenches T1 and T2 and to fill a remaining portion of each of the empty regions, and removing the horizontal insulating layers 190 and the gate electrode layer from the first and second separation trenches T1 and T2. The gate electrodes EL and the horizontal insulating layers 190 may be formed between the insulating layers 120. The insulating layers 120 and the gate electrodes EL, which are alternately stacked in the third direction D3, and the horizontal insulating layers 190 may constitute an electrode structure ES.

First separation structures SS1 may be formed to fill the first separation trenches T1. Second separation structures SS2 may be formed to fill the second separation trenches T2. In an example embodiment, the formation of the first and second separation structures SS1 and SS2 may include forming a separation layer on the first upper insulating layer 170 to fill the first and second separation trenches T1 and T2, and planarizing the separation layer to expose a top surface of the first upper insulating layer 170, such that the first and second separation structures SS1 and SS2 may be locally formed in the first and second separation trenches T1 and T2.

Referring to FIGS. 5, 13A, and 13B, each of the gate electrodes EL may include a pad portion PAD on the connection region CNR. The pad portions PAD of the gate electrodes EL may have a stepwise structure on the connection region CNR. As an example, the pad portions PAD of even-numbered gate electrodes EL of the gate electrodes EL may be provided to form a stepwise structure in the first direction D1, and the pad portions PAD of odd-numbered gate electrodes EL of the gate electrodes EL may be offset from the pad portions PAD of the even-numbered gate electrodes EL in the second direction D2. The pad portions PAD of the odd-numbered gate electrodes EL may be provided to form a stepwise structure in the first direction D1. The pad portions PAD of the even-numbered gate electrodes EL may be disposed between one of the first separation structures SS1 and the second separation structures SS2. The pad portions PAD of the odd-numbered gate electrodes EL may be disposed between another of the first separation structures SS1 and the second separation structures SS2. The second separation structures SS2 may be disposed between the pad portions PAD of the even-numbered gate electrodes EL and the pad portions PAD of the odd-numbered gate electrodes EL.

Figure 14A:
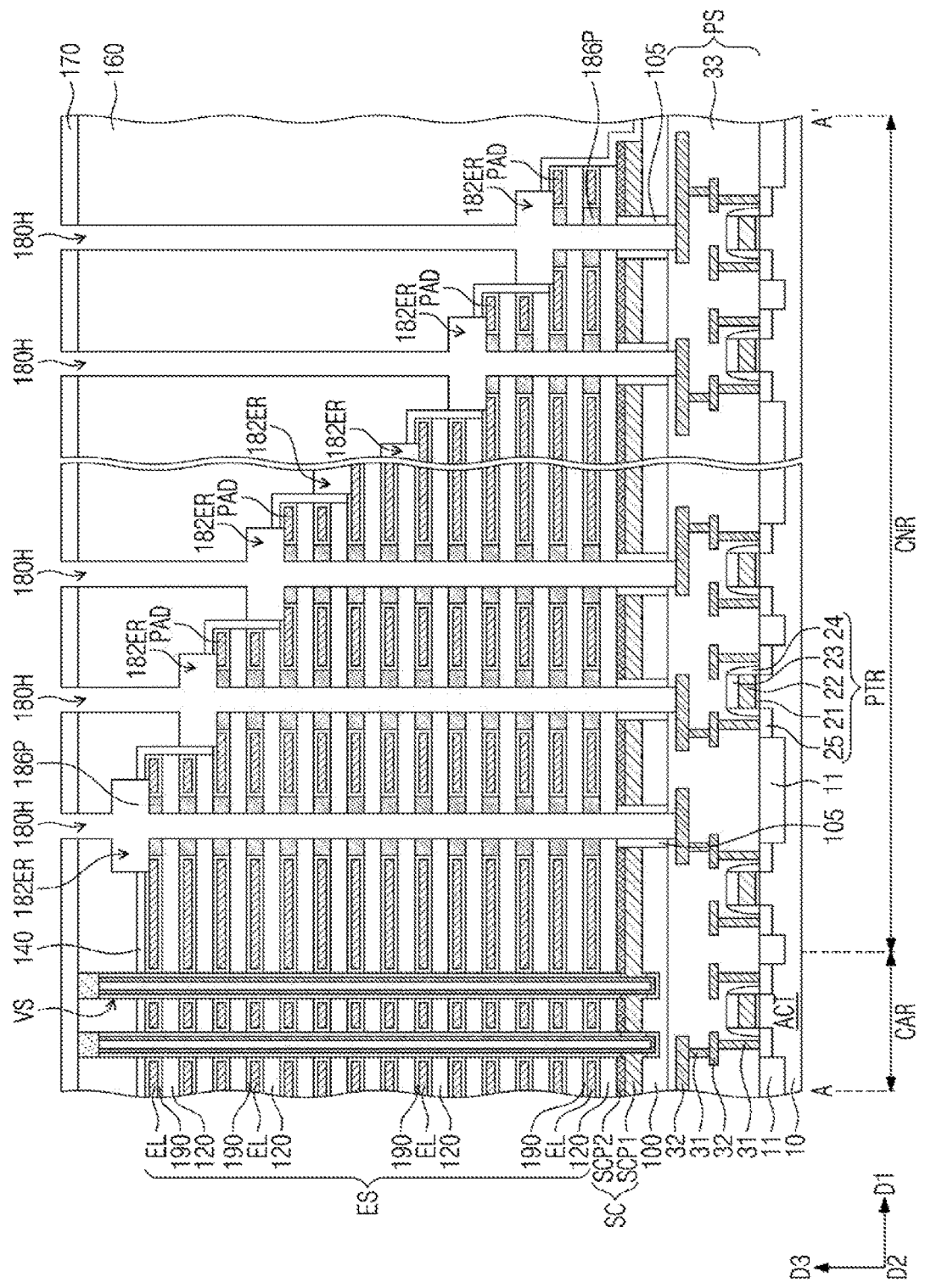
Figure 14B:
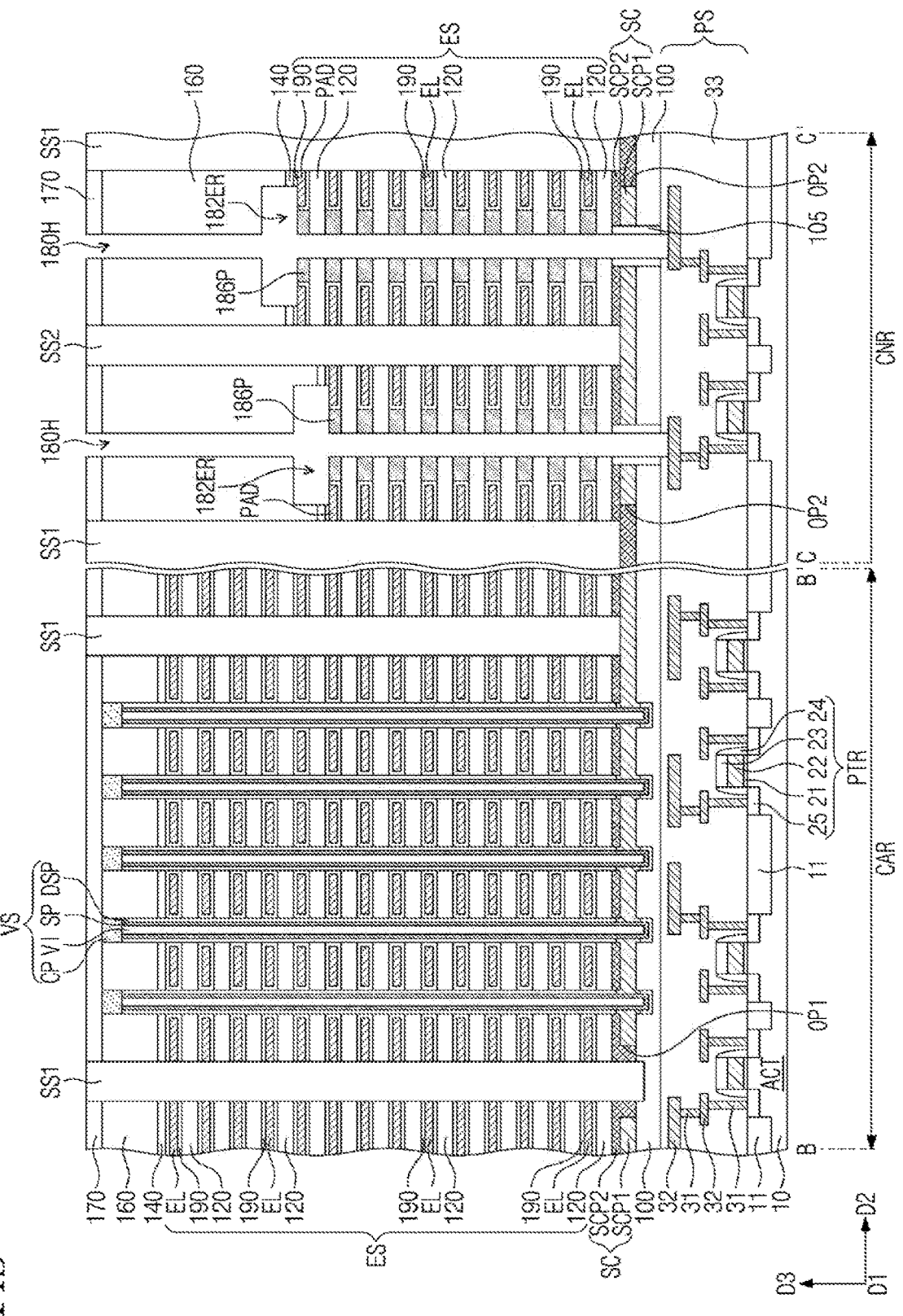

Referring to FIGS. 14A and 14B, the sacrificial poly layer 188 may be removed, and a portion of the blocking layer 186 may be removed. The removal of the portion of the blocking layer 186 may include removing or etching the blocking layer 186 in each of the vertical contact holes 180H and each of the first horizontal recess regions 182R. Portions of the blocking layer 186 filling the second horizontal recess regions 184R may not be removed (e.g., etched), and such remaining portions may be referred to as blocking patterns 186P.

After the removal of the blocking layer 186 in each of the first horizontal recess regions 182R, a portion of the sacrificial oxide layer 140 and a portion of the horizontal insulating layer 190, which are exposed by each of the first horizontal recess regions 182R, may be removed such that extended first horizontal recess regions 182ER may be formed. Each of the extended first horizontal recess regions 182ER may be a region, which is formed by extending each of the first horizontal recess regions 182R vertically (e.g., in the third direction D3), and may be formed to expose a top surface of the pad portion PAD of a corresponding one of the gate electrodes EL.

In an example embodiment, the removing of the sacrificial poly layer 188 and the partial removing of the blocking layer 186, the sacrificial oxide layer 140, and the horizontal insulating layer 190 may be performed using a wet etching method.

Figure 15A:
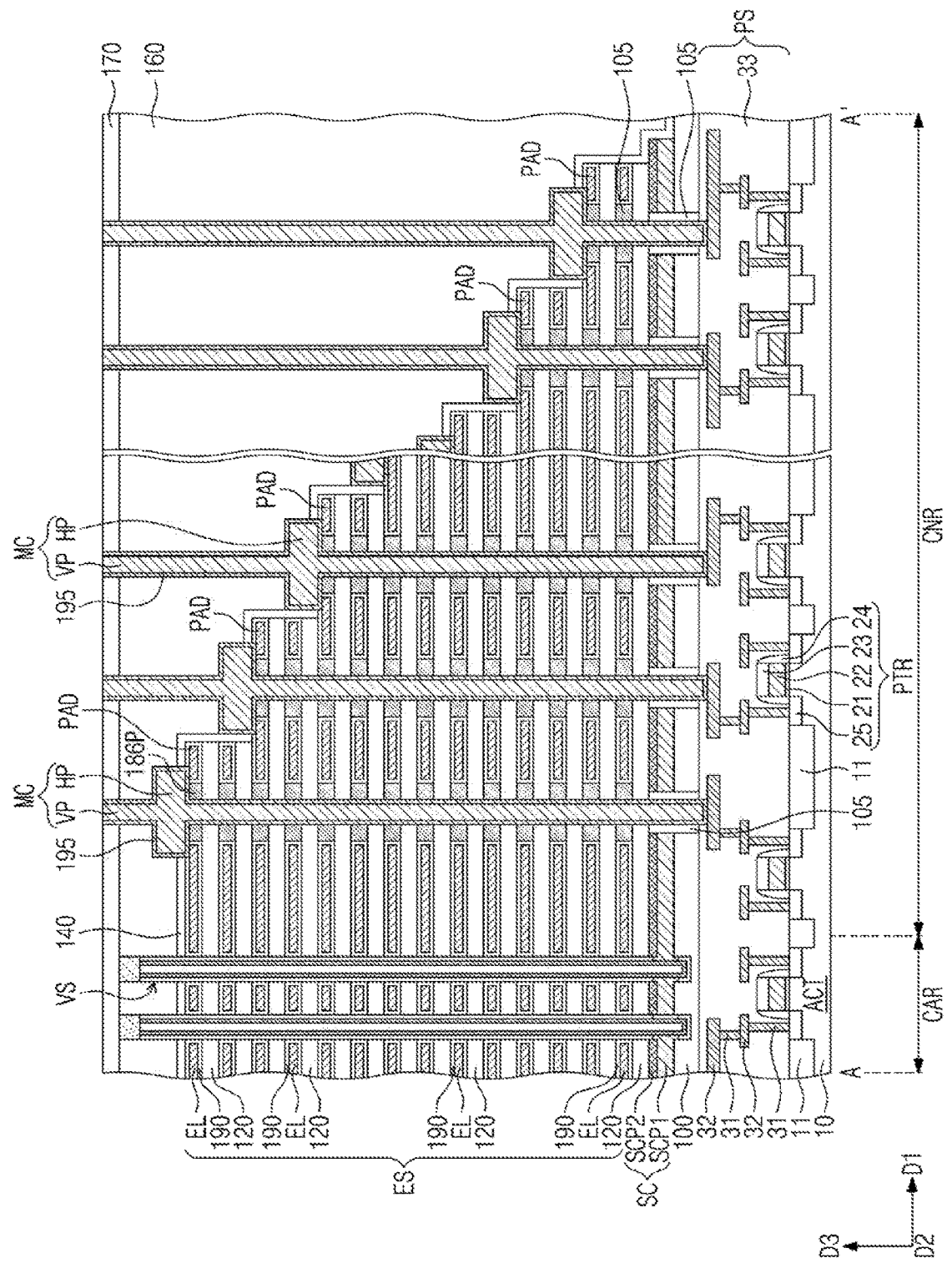
Figure 15B:
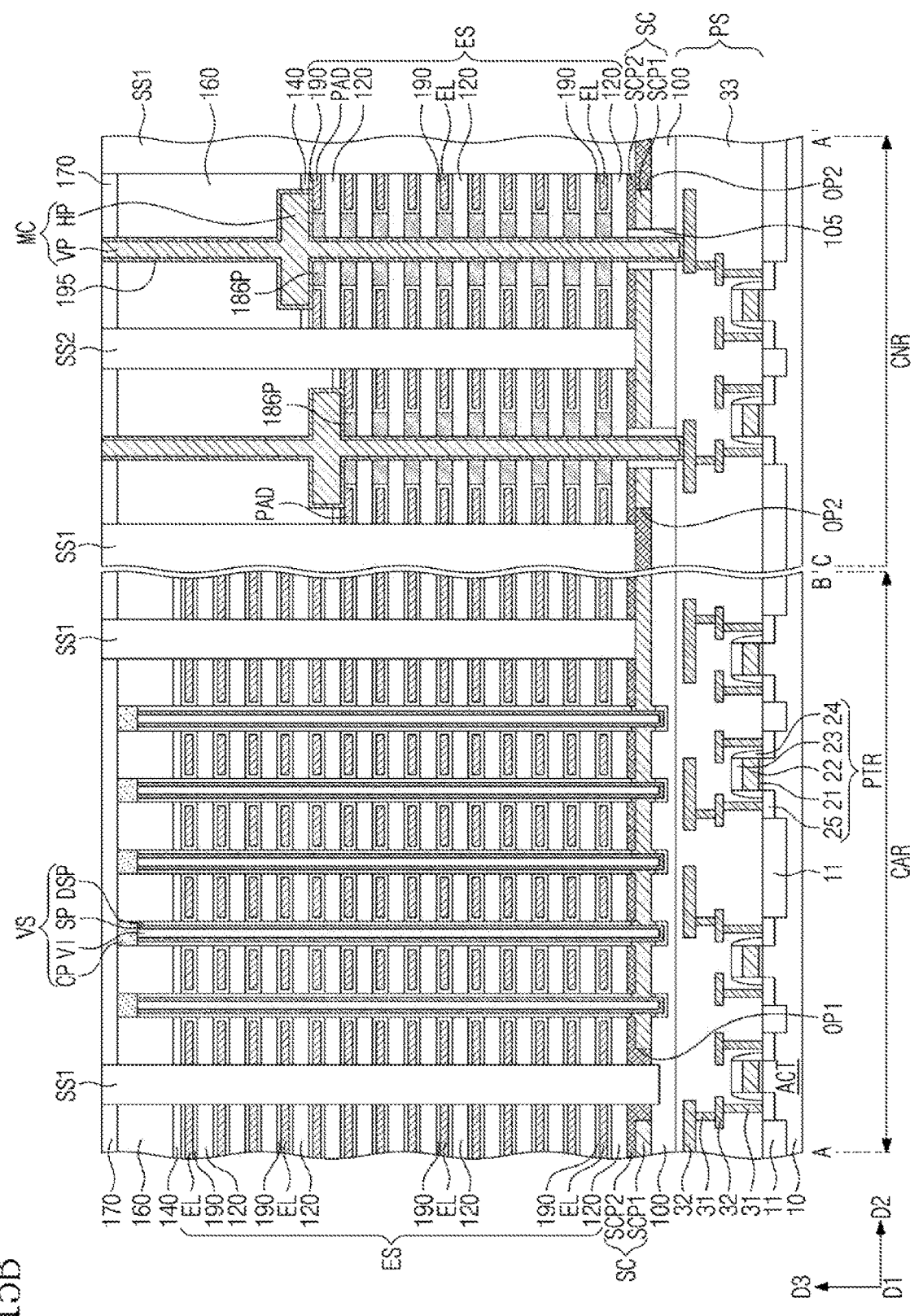

Referring to FIGS. 15A and 15B, a contact barrier layer 195 may be formed to conformally cover an inner surface of each of the vertical contact holes 180H and an inner surface of each of the extended first horizontal recess regions 182ER. The cell contact plug MC may be formed to fill a remaining portion of each of the vertical contact holes 180H and a remaining portion of each of the extended first horizontal recess regions 182ER. In an example embodiment, the formation of the contact barrier layer 195 and the cell contact plug MC may include forming the contact barrier layer 195 on the first upper insulating layer 170 to conformally cover an inner surface of each of the vertical contact holes 180H and an inner surface of each of the extended first horizontal recess regions 182ER, forming a contact conductive layer on the contact barrier layer 195 to fill a remaining portion of each of the vertical contact holes 180H and a remaining portion of each of the extended first horizontal recess regions 182ER, and planarizing the contact barrier layer 195 and the contact conductive layer to expose a top surface of the first upper insulating layer 170. The planarization may be performed using, e.g., a chemical mechanical polishing (CMP) process or an etch-back process.

The cell contact plug MC may include a vertical portion VP, which is formed to fill each of the vertical contact holes 180H, and a horizontal portion HP, which is formed to fill each of the extended first horizontal recess regions 182ER. The vertical portion VP may be extended in the third direction D3 to penetrate the first upper insulating layer 170, the planarization insulating layer 160, and the electrode structure ES. The vertical portion VP may penetrate a corresponding one of the insulating patterns 105, may be extended into the peripheral insulating layer 33, and may be directly and electrically connected to a corresponding one of the peripheral lines 32. The horizontal portion HP may be horizontally extended to cover a top surface of the pad portion PAD of a corresponding one of the gate electrodes EL. A bottom surface of the horizontal portion HP may be in contact with the top surface of the pad portion PAD of the corresponding gate electrode EL in a vertical direction (e.g., in the third direction D3). As a result of the vertical contact between the bottom surface of the horizontal portion HP and the top surface of the pad portion PAD of the corresponding gate electrode EL, the cell contact plug MC may be electrically connected to the pad portion PAD of the corresponding gate electrode EL.

The contact barrier layer 195 may be interposed between the cell contact plug MC and the first upper insulating layer 170, between the cell contact plug MC and the planarization insulating layer 160, between the cell contact plug MC and the sacrificial oxide layer 140, and between the cell contact plug MC and the horizontal insulating layer 190, and may extend into a region between the bottom surface of the horizontal portion HP of the cell contact plug MC and the top surface of the pad portion PAD of the corresponding gate electrode EL. The contact barrier layer 195 may be interposed between the vertical portion VP of the cell contact plug MC and the blocking patterns 186P, between the vertical portion VP and the insulating layers 120, and between the vertical portion VP and the corresponding insulating pattern 105, and may extend into a region between a bottom surface of the vertical portion VP and the corresponding peripheral line 32.

Referring back to FIGS. 5, 6A, and 6B, a second upper insulating layer 200 may be formed on the first upper insulating layer 170 to cover top surfaces of the first and second separation structures SS1 and SS2 and the cell contact plug MC.

Bit lines 220 may be formed on the cell array region CAR and on the second upper insulating layer 200, and conductive connection lines 240 may be formed on the connection region CNR and on the second upper insulating layer 200. Bit line contacts 210 may be formed to penetrate the first and second upper insulating layer 170 and 200 on the cell array region CAR, and connection contacts 230 may be formed to penetrate the second upper insulating layer 200 on the connection region CNR. The vertical channel structures VS may be electrically connected to the bit lines 220 through the bit line contacts 210, and the cell contact plug MC may be electrically connected to a corresponding one of the conductive connection lines 240 through a corresponding one of the connection contacts 230.

According to an example embodiment, the cell contact plug MC may be electrically connected to the pad portion PAD of the corresponding gate electrode EL, as a result of a vertical contact between a bottom surface of the horizontal portion HP and a top surface of the pad portion PAD of the corresponding gate electrode EL. The horizontal portion HP of the cell contact plug MC may be horizontally spaced apart from the first and second separation structures SS1 and SS2 adjacent thereto. The formation of the horizontal portion HP of the cell contact plug MC may include forming the sacrificial pad pattern 150 on an exposed end portion 130EP of a corresponding one of the sacrificial layers 130 of the mold structure TS, removing the sacrificial pad pattern 150 to form the first horizontal recess region 182R, etching the sacrificial oxide layer 140 and the horizontal insulating layer 190 exposed by the first horizontal recess region 182R to form the extended first horizontal recess region 182ER, and filling the extended first horizontal recess region 182ER with the contact barrier layer 195 and the contact conductive layer.

Since the sacrificial pad pattern 150 is formed on the exposed end portion 130EP of the sacrificial layer 130, it may be possible to remove a limitation on a thickness of the sacrificial pad pattern 150. In addition, the gate electrodes EL in the electrode structure ES may be formed by depositing the gate electrode layer through the first and second separation trenches T1 and T2, and the horizontal portion HP of the cell contact plug MC may be formed by filling the extended first horizontal recess region 182ER with the contact barrier layer 195 and the contact conductive layer. In this case, even when the sacrificial pad pattern 150 is horizontally spaced apart from the first and second separation trenches T1 and T2, it may be possible to easily form the gate electrodes EL and the horizontal portion HP of the cell contact plug MC and to easily realize a vertical contact between a bottom surface of the horizontal portion HP and a top surface of the pad portion PAD of the corresponding gate electrode EL.

Thus, it may be possible to easily fabricate a three-dimensional semiconductor memory device with improved electric characteristics.

Figure 16:
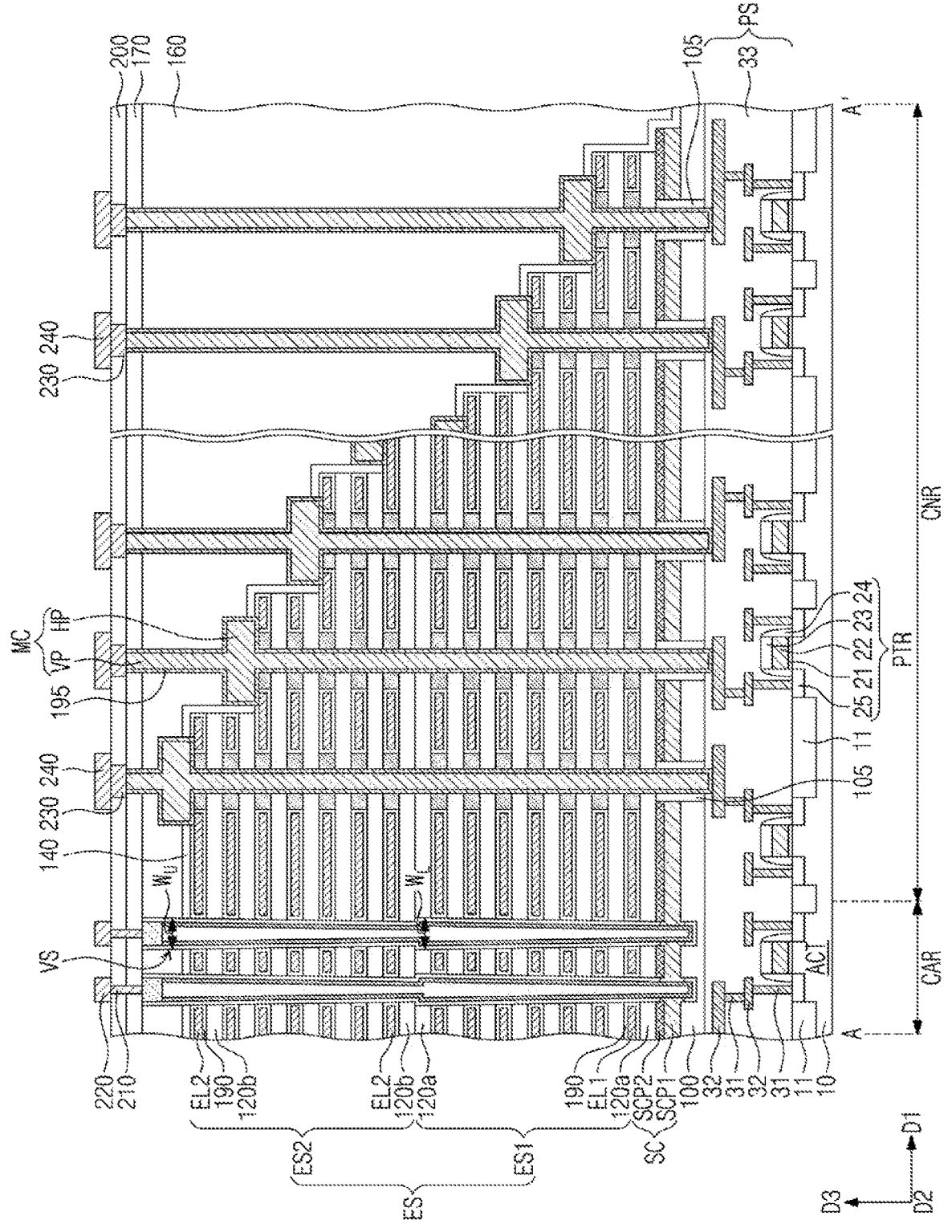
FIG. 16 is a sectional view illustrating a three-dimensional semiconductor memory device according to an example embodiment and in particular corresponding to the line A-A' of FIG. 5.

FIG. 16 is a sectional view illustrating a three-dimensional semiconductor memory device according to an example embodiment and in particular corresponding to the line A-A' of FIG. 5. For concise description, an element in the three-dimensional semiconductor memory device previously described with reference to FIGS. 5, 6A, 6B, 7A, and 7B may be identified by the same reference number without repeating an overlapping description thereof.

Referring to FIG. 16, the electrode structure ES may include a first electrode structure ES1 and a second electrode structure ES2, which are sequentially stacked on the source structure SC. The first electrode structure ES1 may include first gate electrodes EL1 and first insulating layers 120a, which are alternately stacked in the third direction D3 (i.e., the vertical direction). The second electrode structure ES2 may include second gate electrodes EL2 and second insulating layers 120b, which are alternately stacked in the third direction D3 (i.e., the vertical direction). The lowermost one of the first insulating layers 120a may be interposed between the lowermost one of the first gate electrodes EL1 and the source structure SC. The uppermost one of the first insulating layers 120a may be interposed between the uppermost one of the first gate electrodes EL1 and the lowermost one of the second insulating layers 120b. The lowermost second insulating layer 120b may be interposed between the lowermost one of the second gate electrodes EL2 and the uppermost first insulating layer 120a, and may be in direct contact with the uppermost first insulating layer 120a. Thus, insulating layers between the uppermost first gate electrode EL1 and the lowermost second gate electrode EL2 (i.e., the uppermost first insulating layer 120a and the lowermost second insulating layer 120b that are in direct contact with each other) may be thicker than the first insulating layers 120a and the second insulating layers 120b.

Each of the vertical channel structures VS may be provided to penetrate the first electrode structure ES1, the second electrode structure ES2, and the source structure SC and may be extended into the semiconductor layer 100. Each of the vertical channel structures VS may have a width in a direction (e.g., the first or second direction D1 or D2) that is parallel to the top surface of the semiconductor substrate 10. A lower width WL of each of the vertical channel structures VS in the first electrode structure ES1 may increase in the third direction D3 or with increasing distance from the semiconductor layer 100, and an upper width Wu of each of the vertical channel structures VS in the second electrode structure ES2 may increase in the third direction D3 or with increasing distance from the first electrode structure ES1. In the insulating layer between the uppermost first gate electrode EL1 and the lowermost second gate electrode EL2 (i.e., the uppermost first insulating layer 120a and the lowermost second insulating layer 120b that are in direct contact with each other), the lower width WL of each of the vertical channel structures VS may be larger than the upper width Wu of each of the vertical channel structures VS. Thus, each of the vertical channel structures VS may have a horizontally protruding portion, in the insulating layer between the uppermost first gate electrode EL1 and the lowermost second gate electrode EL2 (i.e., the uppermost first insulating layer 120a and the lowermost second insulating layer 120b that are in direct contact with each other).

Except for the afore-described differences, the three-dimensional semiconductor memory device according to the present example embodiment may be substantially the same as the three-dimensional semiconductor memory device described with reference to FIGS. 5, 6A, 6B, 7A, and 7B.

Figure 17:
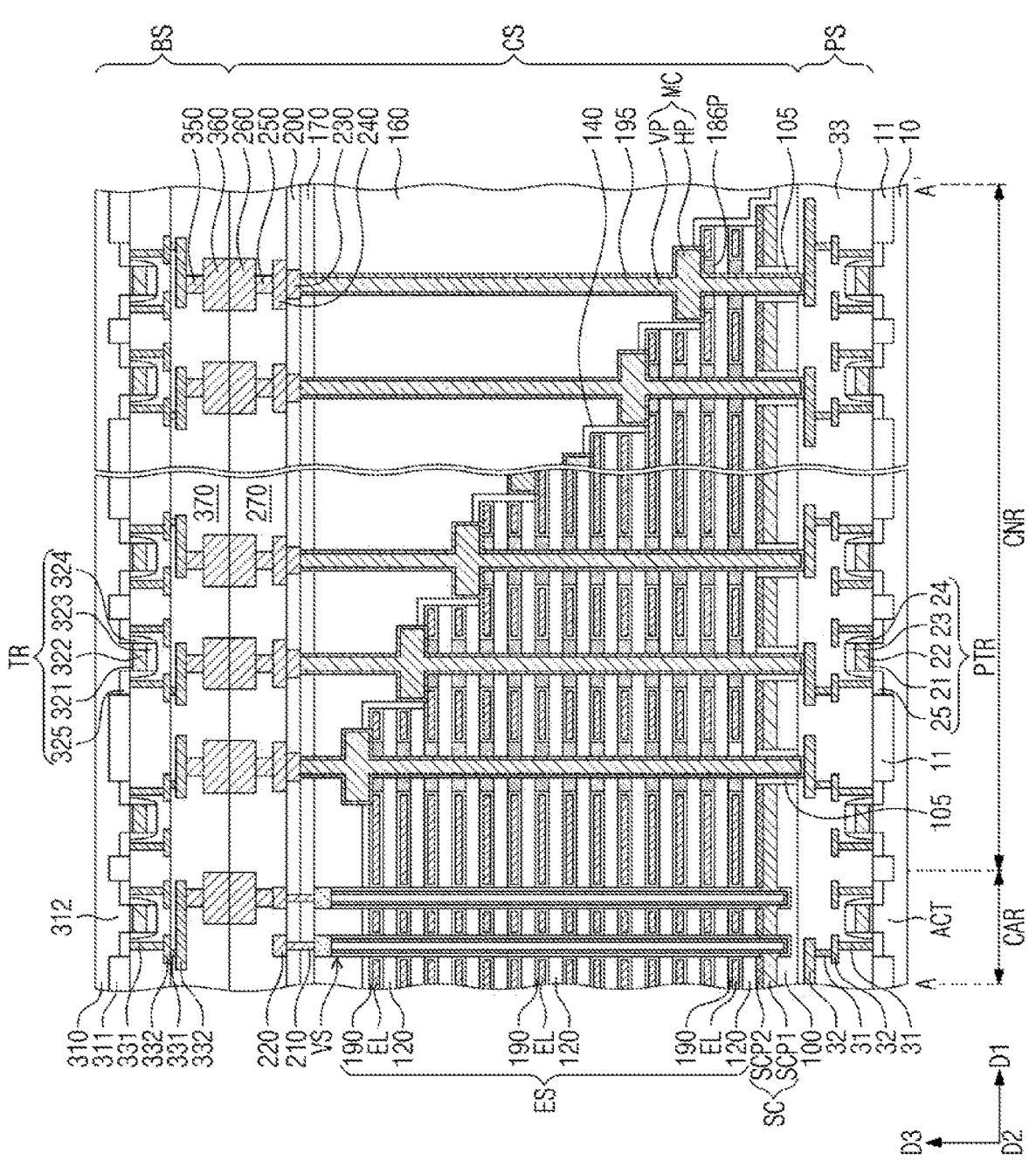
FIG. 17 is a sectional view illustrating a three-dimensional semiconductor memory device according to an example embodiment and in particular corresponding to the line A-A' of FIG. 5.

FIG. 17 is a sectional view illustrating a three-dimensional semiconductor memory device according to an example embodiment and in particular corresponding to the line A-A' of FIG. 5. For concise description, an element in the three-dimensional semiconductor memory device previously described with reference to FIGS. 5, 6A, 6B, 7A, and 7B may be identified by the same reference number without repeating an overlapping description thereof.

Referring to FIG. 17, the cell array structure CS may further include a first protection layer 270, which is provided on the second upper insulating layer 200, and first bonding pads 260 and first bonding contacts 250, which are provided in the first protection layer 270. The first bonding contacts 250 may be physically or electrically connected to the bit lines 220 and the conductive connection lines 240, and the first bonding pads 260 may be physically or electrically connected to the first bonding contacts 250, respectively. The bit lines 220 and the conductive connection lines 240 may be electrically connected to the first bonding pads 260 through the first bonding contacts 250. The first bonding contacts 250 and the first bonding pads 260 may be formed of or include at least one of metallic materials (e.g., copper). The first protection layer 270 may be disposed on the second upper insulating layer 200 to cover the bit lines 220, the conductive connection lines 240, the first bonding contacts 250, and the first bonding pads 260. The first protection layer 270 may be provided to expose top surfaces of the first bonding pads 260. In an example embodiment, the top surfaces of the first bonding pads 260 may be located at substantially the same height as a top surface of the first protection layer 270. The first protection layer 270 may be formed of or include at least one of insulating materials (e.g., silicon oxide).

A circuit structure BS may be disposed on the cell array structure CS, which may be disposed between the peripheral circuit structure PS and the circuit structure BS.

The circuit structure BS may include a substrate 310, a device isolation layer 311, which is disposed in the substrate 310 to define an active region 312, transistors TR, which are provided on the active region 312, contacts 331 and interconnection lines 332, which are electrically connected to the transistors TR, second bonding contacts 350 and second bonding pads 360, which are connected to the contacts 331 and the interconnection lines 332, and a second protection layer 370, which are provided to cover the transistors TR, the contacts 331, the interconnection lines 332, the second bonding contacts 350, and the second bonding pads 360.

In an example embodiment, the substrate 310 may be a silicon substrate, a silicon germanium substrate, a germanium substrate, or a structure including a single-crystalline silicon substrate and a single-crystalline epitaxial layer grown therefrom. The device isolation layer 311 may be disposed in an upper portion of the substrate 310, and may be formed of or include at least one of insulating materials (e.g., silicon oxide). The active region 312 may be a portion of the substrate 310 interposed between adjacent ones of the device isolation layers 311.

The transistors TR may include a gate insulating layer 321, a gate electrode 322, a capping pattern 323, gate spacers 324, and source/drain regions 325. The gate insulating layer 321, the gate electrode 322, and the capping pattern 323 may be sequentially stacked on the active region 312 of the substrate 310. The gate spacers 324 may be respectively disposed on side surfaces of the gate electrode 322, and may extend to cover side surfaces of the capping pattern 323 and side surfaces of the gate insulating layer 321. The source/drain regions 325 may be in portions of the active region 312 located at both sides of the gate electrode 322. The transistors TR may be NMOS or PMOS transistors, and may be fin field effect transistors (FinFET), multi-bridge channel field effect transistors (MBCFET), or gate-all-around (GAA) type transistors.

The interconnection lines 332 may be electrically connected to the transistors TR through the contacts 331. The interconnection lines 332 and the contacts 331 may be formed of or include at least one of conductive or metallic materials. The second bonding pads 360 may be electrically connected to the interconnection lines 332 through the second bonding contacts 350 and may be electrically connected to the transistors TR through the interconnection lines 332 and the contacts 331. The second bonding contacts 350 and the second bonding pads 360 may be formed of or include at least one of metallic materials (e.g., copper). The second protection layer 370 may be disposed on the substrate 310 to cover the transistors TR, the contacts 331, the interconnection lines 332, the second bonding contacts 350, and the second bonding pads 360. The second protection layer 370 may be provided to expose top surfaces of the second bonding pads 360, and here, the top surfaces of the second bonding pads 360 may be located at substantially the same height as a top surface of the second protection layer 370. The second protection layer 370 may be formed of or include at least one of insulating materials (e.g., silicon oxide).

The top surface of the first protection layer 270 and the top surface of the second protection layer 370 may face each other and may be directly bonded together. The top surfaces of the first bonding pads 260 and the top surfaces of the second bonding pads 360 may face each other and may be directly bonded together. As an example, the first bonding pads 260 and the second bonding pads 360 may be bonded to each other through a Cu-to-Cu bonding method.

The vertical channel structures VS and the cell contact plugs MC in the cell array structure CS may be electrically connected to the transistors TR in the circuit structure BS through the bonding between the first and second bonding pads 260 and 360.

According to an example embodiment, as a result of a vertical contact between a bottom surface of a horizontal portion of a cell contact plug and a top surface of a pad portion of a corresponding gate electrode, the cell contact plug may be electrically connected to the pad portion of the corresponding gate electrode. The horizontal portion of the cell contact plug may be horizontally spaced apart from first and second separation structures adjacent thereto. According to an example embodiment, it may be possible to easily realize the vertical contact between the bottom surface of the horizontal portion and the top surface of the pad portion of the corresponding gate electrode, and thereby to easily fabricate a three-dimensional semiconductor memory device with improved electric characteristics.

As described above, embodiments relate to a nonvolatile three-dimensional semiconductor memory device including a vertical channel, a method of fabricating the same, and an electronic system including the same. An example embodiment may provide a three-dimensional semiconductor memory device, which has improved electric characteristics and can be easily fabricated, and a method of fabricating the same. An example embodiment may provide an electronic system including the three-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, it will be understood by those of skill in the art that various changes in form and details may be made without departing from the spirit and scope of the present invention as set forth in the following claims.

What is claimed is:

1. A method of fabricating a three-dimensional semiconductor memory device, the method comprising:

forming a mold structure on a semiconductor substrate including a cell array region and a connection region, the mold structure including insulating layers and sacrificial layers alternately stacked in a vertical direction, the insulating layers exposing end portions of the sacrificial layers on the connection region, the exposed end portions of the sacrificial layers forming a stepwise structure on the connection region;

forming a sacrificial oxide layer on the mold structure to cover the exposed end portions of the sacrificial layers;

forming sacrificial pad patterns on the exposed end portions of the sacrificial layers, respectively, the sacrificial oxide layer being interposed between the exposed end portions of the sacrificial layers and the sacrificial pad patterns;

forming vertical contact holes to penetrate the sacrificial pad patterns, respectively, and to penetrate the sacrificial oxide layer and the mold structure below the sacrificial pad patterns;

removing the sacrificial pad patterns, which are exposed by the vertical contact holes, to form first horizontal recess regions laterally extending from the vertical contact holes and exposing upper surfaces of the sacrificial oxide layer;

recessing the sacrificial layers, which are exposed by each of the vertical contact holes, to form second horizontal recess regions;

forming blocking patterns to fill the second horizontal recess regions;

removing portions of the sacrificial oxide layer, which are exposed by the first horizontal recess regions, to form extended first horizontal recess regions laterally extending from the vertical contact holes and exposing side surfaces of the sacrificial oxide layer; and forming cell contact plugs to fill the vertical contact holes and the extended first horizontal recess regions.

2. The method as claimed in claim 1, wherein:

the removing of the sacrificial pad patterns to form the first horizontal recess regions includes performing a first etching process to remove the sacrificial pad patterns, and the recessing of the sacrificial layers to form the second horizontal recess regions includes recessing the sacrificial layers by the first etching process.

3. The method as claimed in claim 2, wherein the sacrificial pad patterns include a material that is etched at an etch rate higher than the sacrificial layers.

4. The method as claimed in claim 1, wherein a thickness of each of the sacrificial pad patterns in the vertical direction is larger than a thickness of each of the sacrificial layers in the vertical direction.

5. The method as claimed in claim 1, wherein the forming of the blocking patterns includes:

forming a blocking layer to conformally cover an inner surface of each of the vertical contact holes and an inner surface of each of the first horizontal recess regions and to fill the second horizontal recess regions; and removing the blocking layer in each of the vertical contact holes and each of the first horizontal recess regions.

6. The method as claimed in claim 1, further comprising, before the forming of the blocking patterns:

forming a blocking layer to conformally cover an inner surface of each of the vertical contact holes and an inner surface of each of the first horizontal recess regions and to fill the second horizontal recess regions;

forming a sacrificial poly layer to fill a remaining portion of each of the vertical contact holes and a remaining portion of each of the first horizontal recess regions;

forming separation trenches to penetrate the mold structure;

removing the sacrificial layers, which are exposed by the separation trenches, to form empty regions between the insulating layers; and forming gate electrodes and horizontal insulating layers to fill the empty regions.

7. The method as claimed in claim 6, further comprising:

forming separation structures in the separation trenches, respectively; and removing the sacrificial poly layer, after the forming of the separation structures.

8. The method as claimed in claim 7, wherein the forming of the blocking patterns includes removing the blocking layer in each of the vertical contact holes and each of the first horizontal recess regions, after the removing of the sacrificial poly layer.

9. The method as claimed in claim 8, wherein the forming of the extended first horizontal recess regions includes removing portions of the horizontal insulating layers, which are exposed by the first horizontal recess regions.

10. The method as claimed in claim 8, wherein:

the cell contact plugs are formed between the separation structures, each of the cell contact plugs includes a vertical portion filling a corresponding one of the vertical contact holes and a horizontal portion filling a corresponding one of the extended first horizontal recess regions, and the horizontal portion is horizontally spaced apart from the separation structures.

11. A method of fabricating a three-dimensional semiconductor memory device, the method comprising:

forming a mold structure on a semiconductor substrate including a cell array region and a connection region, the mold structure including insulating layers and sacrificial layers alternately stacked in a vertical direction, the insulating layers exposing end portions of the sacrificial layers on the connection region, the exposed end portions of the sacrificial layers forming a stepwise structure on the connection region;

forming a sacrificial oxide layer on the mold structure to cover the exposed end portions of the sacrificial layers;

forming sacrificial pad patterns on the exposed end portions of the sacrificial layers, respectively, the sacrificial oxide layer being interposed between the exposed end portions of the sacrificial layers and the sacrificial pad patterns;

forming a planarization insulating layer on the mold structure to cover the sacrificial oxide layer and the sacrificial pad patterns;

forming vertical contact holes to penetrate the planarization insulating layer and to penetrate the sacrificial pad patterns, respectively, each of the vertical contact holes penetrating the sacrificial oxide layer and the mold structure below the sacrificial pad patterns;

removing the sacrificial pad patterns to form first horizontal recess regions laterally extending from the vertical contact holes and exposing upper surfaces of the sacrificial oxide layer;

removing portions of the sacrificial oxide layer exposed by the first horizontal recess regions to form extended first horizontal recess regions laterally extending from the vertical contact holes and exposing side surfaces of the sacrificial oxide layer; and forming cell contact plugs to fill the vertical contact holes and the extended first horizontal recess regions.

12. The method as claimed in claim 11, wherein a thickness of each of the sacrificial pad patterns in the vertical direction is larger than a thickness of each of the sacrificial layers in the vertical direction.

13. The method as claimed in claim 11, further comprising:

recessing the sacrificial layers, which are exposed by the vertical contact holes, to form second horizontal recess regions in the mold structure, wherein the second horizontal recess regions are laterally extended from the vertical contact holes.

14. The method as claimed in claim 13, further comprising:

forming a blocking layer to conformally cover an inner surface of each of the vertical contact holes and an inner surface of each of the first horizontal recess regions and to fill the second horizontal recess regions;

forming a sacrificial poly layer to fill a remaining portion of each of the vertical contact holes and a remaining portion of each of the first horizontal recess regions;

forming separation trenches to penetrate the mold structure;

removing the sacrificial layers, which are exposed by the separation trenches, to form empty regions between the insulating layers; and forming gate electrodes and horizontal insulating layers to fill the empty regions.

15. The method as claimed in claim 14, further comprising:

forming separation structures in the separation trenches, respectively;

removing the sacrificial poly layer; and forming blocking patterns, which are locally provided in the second horizontal recess regions.

16. The method as claimed in claim 15, wherein:

the forming of the blocking patterns includes removing the blocking layer in the vertical contact holes and the first horizontal recess regions, and portions of the blocking layer filling the second horizontal recess regions constitute the blocking patterns.

17. The method as claimed in claim 16, wherein:

the removing of the portions of the sacrificial oxide layer to form the extended first horizontal recess regions includes removing a portion of a corresponding one of the horizontal insulating layers exposed by each of the first horizontal recess regions, and each of the extended first horizontal recess regions exposes a top surface of a pad portion of a corresponding one of the gate electrodes.

18. The method as claimed in claim 17, wherein the blocking patterns are interposed between the pad portion of the corresponding one of the gate electrodes and a corresponding one of the vertical contact holes and between the gate electrodes below the corresponding one of the gate electrodes and the corresponding one of the vertical contact holes.

19. The method as claimed in claim 18, wherein:

each of the cell contact plugs includes a vertical portion filling a corresponding one of the vertical contact holes and a horizontal portion filling a corresponding one of the extended first horizontal recess regions, and a bottom surface of the horizontal portion is in vertical contact with the top surface of the pad portion of the corresponding one of the gate electrodes.

20. The method as claimed in claim 11, further comprising:

removing the sacrificial layers to form empty regions in the mold structure; and forming gate electrodes and horizontal insulating layers to fill the empty regions, wherein:

each of the extended first horizontal recess regions exposes a top surface of a pad portion of a corresponding one of the gate electrodes, each of the cell contact plugs includes a vertical portion filling a corresponding one of the vertical contact holes and a horizontal portion filling a corresponding one of the extended first horizontal recess regions, and a bottom surface of the horizontal portion is in vertical contact with the top surface of the pad portion of the corresponding one of the gate electrodes.

* * * * *